(12) United States Patent
Hassan et al.

(10) Patent No.: US 11,380,988 B2
(45) Date of Patent: Jul. 5, 2022

(54) ANTENNA SWITCHING SCHEME

(71) Applicant: QUALCOMM Incorporated, San Diego, CA (US)

(72) Inventors: Muhammad Hassan, San Diego, CA (US); Jeremy Goldblatt, Encinitas, CA (US); Bhushan Shanti Asuri, San Diego, CA (US); Jeremy Darren Dunworth, La Jolla, CA (US); Abdellatif Bellaouar, Richardson, TX (US); Ravi Sridhara, San Diego, CA (US); Jorge Garcia, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 17/098,319

(22) Filed: Nov. 13, 2020

(65) Prior Publication Data
US 2022/0158343 A1 May 19, 2022

(51) Int. Cl.
*H01Q 3/24* (2006.01)
*H04B 1/44* (2006.01)
*H01Q 21/12* (2006.01)
*H01Q 21/20* (2006.01)

(52) U.S. Cl.
CPC ............ *H01Q 3/247* (2013.01); *H01Q 21/12* (2013.01); *H01Q 21/20* (2013.01)

(58) Field of Classification Search
CPC ............ H01Q 1/38; H01Q 3/24; H01Q 3/247; H01Q 21/12; H01Q 21/06; H01Q 21/065; H01Q 21/20; H01Q 21/30; H04B 1/18; H04B 1/44; H04B 1/48
See application file for complete search history.

(56) References Cited

U.S. PATENT DOCUMENTS

| | | | |
|---|---|---|---|
| 6,332,071 B1 * | 12/2001 | Brandt | H01P 1/15 333/101 |
| 8,135,357 B1 * | 3/2012 | Chang | H04B 1/48 331/49 |
| 10,193,521 B2 * | 1/2019 | Bakalski | H04B 1/0458 |
| 10,367,539 B2 | 7/2019 | Robert et al. | |
| 10,389,358 B1 * | 8/2019 | Wang | H03K 19/0185 |

(Continued)

OTHER PUBLICATIONS

Adabi E., et al., "A mm-Wave Transformer Based Transmit/Receive Switch in 90nm CMOS Technology," 2009 European Microwave Conference (EuMC), Rome, 2009, pp. 389-392, Retrieved from the Internet, URL: http://ieeexplore.ieee.org/stamp/stamp.jsp?tp=&arnumber=5295932&isnumber=5295900.

(Continued)

*Primary Examiner* — Tho G Phan
(74) *Attorney, Agent, or Firm* — Loza & Loza, LLP

(57) ABSTRACT

In some aspects, an apparatus includes a transformer including a first inductor, a second inductor, and a third inductor. The apparatus also includes a power amplifier coupled to the first inductor, a first antenna coupled to a first terminal of the second inductor, a second antenna coupled to a second terminal of the second inductor, a first switch coupled between the first terminal of the second inductor and a ground, a second switch coupled between the second terminal of the second inductor and the ground, and a low-noise amplifier coupled to the third inductor.

30 Claims, 22 Drawing Sheets

(56) References Cited

U.S. PATENT DOCUMENTS

| | | |
|---|---|---|
| 11,228,337 B2 * | 1/2022 | Yoo .................. H01Q 21/28 |
| 2005/0090287 A1 | 4/2005 | Rofougaran |
| 2006/0084392 A1 | 4/2006 | Marholev et al. |
| 2011/0273355 A1 * | 11/2011 | Ahn .................. H01Q 1/50 |
| | | 343/860 |
| 2012/0083224 A1 | 4/2012 | Visser et al. |
| 2014/0043203 A1 * | 2/2014 | Sabouri ............... H01Q 9/14 |
| | | 343/860 |
| 2020/0028536 A1 | 1/2020 | Liu |
| 2020/0099144 A1 | 3/2020 | Liu et al. |

OTHER PUBLICATIONS

Co-Pending U.S. Appl. No. 16/595,987, filed Oct. 8, 2019.
Prummel J., et al., "A 10 mW Bluetooth Low-Energy Transceiver With On-Chip Matching", IEEE Journal of Solid-State Circuits, vol. 50, No. 12, Dec. 2015, pp. 3077-3088.
International Search Report and Written Opinion—PCT/US2021/055204—ISA/EPO—dated Feb. 2, 2022.

* cited by examiner

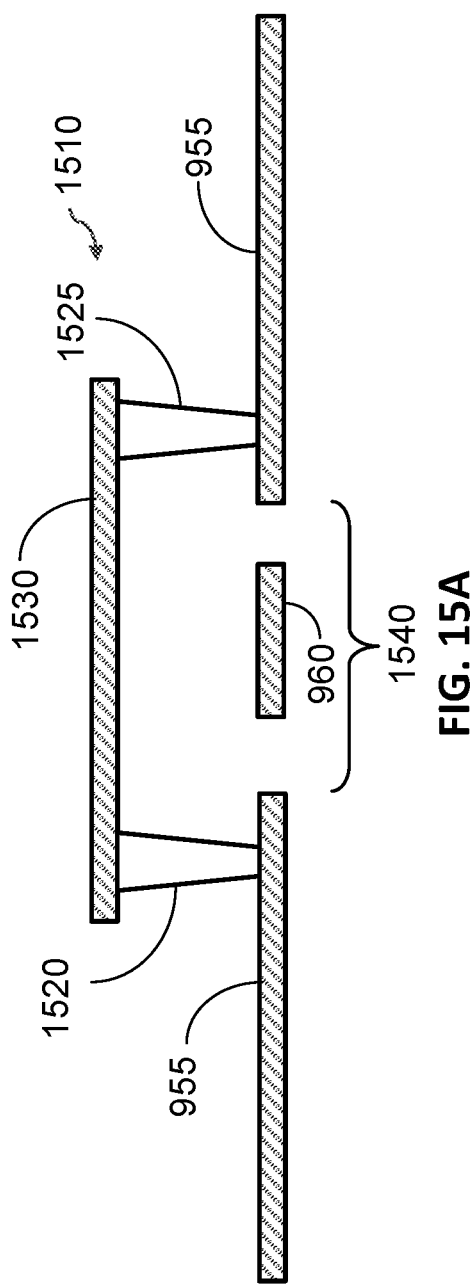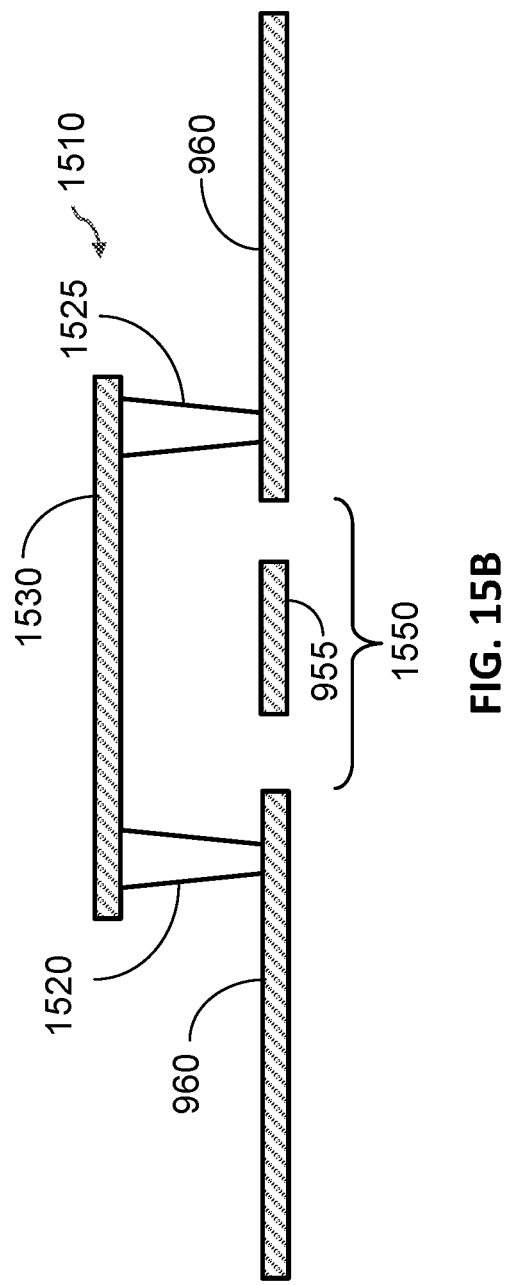

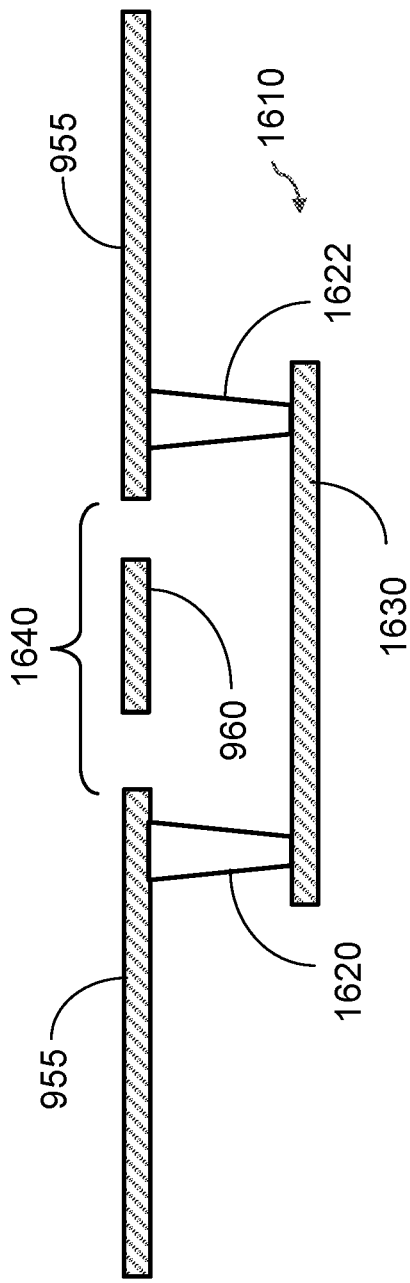 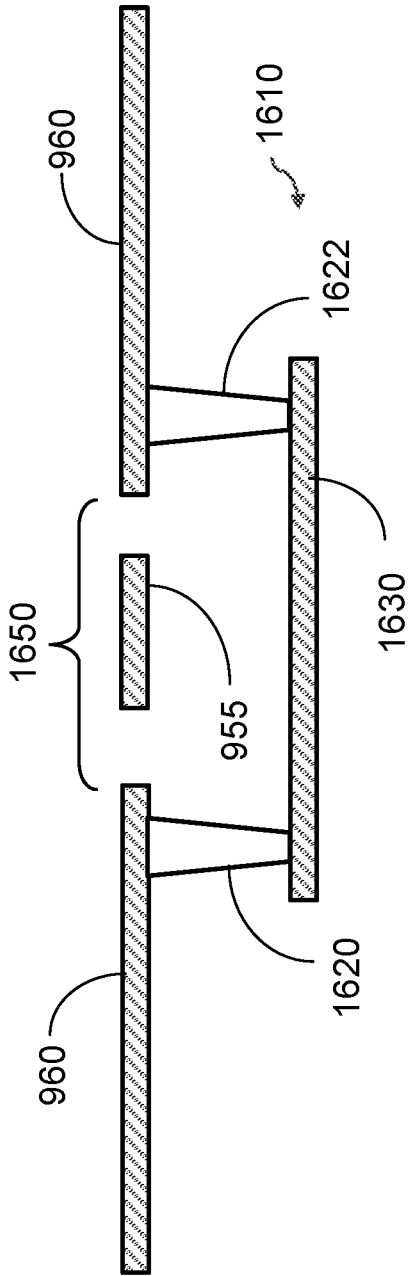

ANTENNA SWITCHING SCHEME

BACKGROUND

Field

Aspects of the present disclosure relate generally to wireless communications, and, more particularly, to antenna switching.

Background

A wireless device may include multiple antenna arrays for transmitting and/or receiving radio frequency (RF) signals in different directions and/or different frequencies. For example, the antenna arrays may be mounted on different sides of the wireless device to provide coverage in different directions.

SUMMARY

The following presents a simplified summary of one or more implementations in order to provide a basic understanding of such implementations. This summary is not an extensive overview of all contemplated implementations and is intended to neither identify key or critical elements of all implementations nor delineate the scope of any or all implementations. Its sole purpose is to present some concepts of one or more implementations in a simplified form as a prelude to the more detailed description that is presented later.

A first aspect relates to an apparatus. The apparatus includes a transformer including a first inductor, a second inductor, and a third inductor. The apparatus also includes a power amplifier coupled to the first inductor, a first antenna coupled to a first terminal of the second inductor, a second antenna coupled to a second terminal of the second inductor, a first switch coupled between the first terminal of the second inductor and a ground, a second switch coupled between the second terminal of the second inductor and the ground, and a low-noise amplifier coupled to the third inductor.

A second aspect relates to a wireless device. The wireless device includes a first antenna array comprising a first plurality of antennas, a second antenna array comprising a second plurality of antennas, a plurality of power amplifiers, a plurality of low-noise amplifiers, and a plurality of switching circuits. Each of the plurality of switching circuits includes a transformer including a first inductor, a second inductor, and a third inductor, wherein the first inductor is coupled to a respective one of the plurality of power amplifiers, a first terminal of the second inductor is coupled to a respective one of the first plurality of antennas, a second terminal of the second inductor is coupled to a respective one of the second plurality of antennas, and the third inductor is coupled to a respective one of the plurality of low-noise amplifiers. Each of the plurality of switching circuits also includes a first switch coupled between the first terminal of the second inductor and a ground, and a second switch coupled between the second terminal of the second inductor and the ground.

A third aspect relates to an apparatus. The apparatus includes a transformer including a first inductor, a second inductor, a third inductor, and a fourth inductor. The apparatus also includes a power amplifier coupled to the first inductor, a low-noise amplifier coupled to the second inductor, a first antenna coupled to a first terminal of the third inductor, a first switch coupled between a second terminal of the third inductor and a ground, a second antenna coupled to a first terminal of the fourth inductor, and a second switch coupled between a second terminal of the fourth inductor and the ground.

A fourth aspect relates to a wireless device. The wireless device includes a first antenna array comprising a first plurality of antennas, a second antenna array comprising a second plurality of antennas, a plurality of power amplifiers, a plurality of low-noise amplifiers, and a plurality of switching circuits. Each of the plurality of switching circuits includes a transformer including a first inductor, a second inductor, a third inductor, and a fourth inductor, wherein the first inductor is coupled to a respective one of the plurality of power amplifiers, the second inductor is coupled to a respective one of the plurality of low-noise amplifiers, a first terminal of the third inductor is coupled to a respective one of the first plurality of antennas, and a first terminal of the fourth inductor is coupled to a respective one of the second plurality of antennas. Each of the plurality of switching circuits also includes a first switch coupled between a second terminal of the third inductor and a ground, and a second switch coupled between a second terminal of the fourth inductor and the ground.

BRIEF DESCRIPTION OF THE DRAWINGS

FIG. 15A shows an exemplary overpass structure according to certain aspects of the present disclosure.

FIG. 15B shows another exemplary overpass structure according to certain aspects of the present disclosure.

FIG. 16A shows an exemplary underpass structure according to certain aspects of the present disclosure.

FIG. 16B shows another exemplary underpass structure according to certain aspects of the present disclosure.

DETAILED DESCRIPTION

The detailed description set forth below, in connection with the appended drawings, is intended as a description of various configurations and is not intended to represent the only configurations in which the concepts described herein may be practiced. The detailed description includes specific details for the purpose of providing a thorough understanding of the various concepts. However, it will be apparent to those skilled in the art that these concepts may be practiced without these specific details. In some instances, well-known structures and components are shown in block diagram form in order to avoid obscuring such concepts.

A wireless device may include multiple antenna arrays for transmitting and/or receiving radio frequency (RF) signals in different directions and/or different frequencies. In one example, the antenna arrays may be mounted on different sides of the wireless device to provide coverage in different directions. The wireless device may electronically steer the beam direction of an antenna array using beamforming.

In certain aspects, the antenna arrays may transmit and/or receive RF signals in the millimeter wave (mmWave) band, which supports high data rates. Operating in the mmWave band allows the use of small antennas, which significantly reduces the sizes of the antenna arrays. This allows the antenna arrays to be incorporated in a mobile wireless device (e.g., handset). However, it is to be appreciated that the present disclosure is not limited to the mmWave band.

Figure 1A:
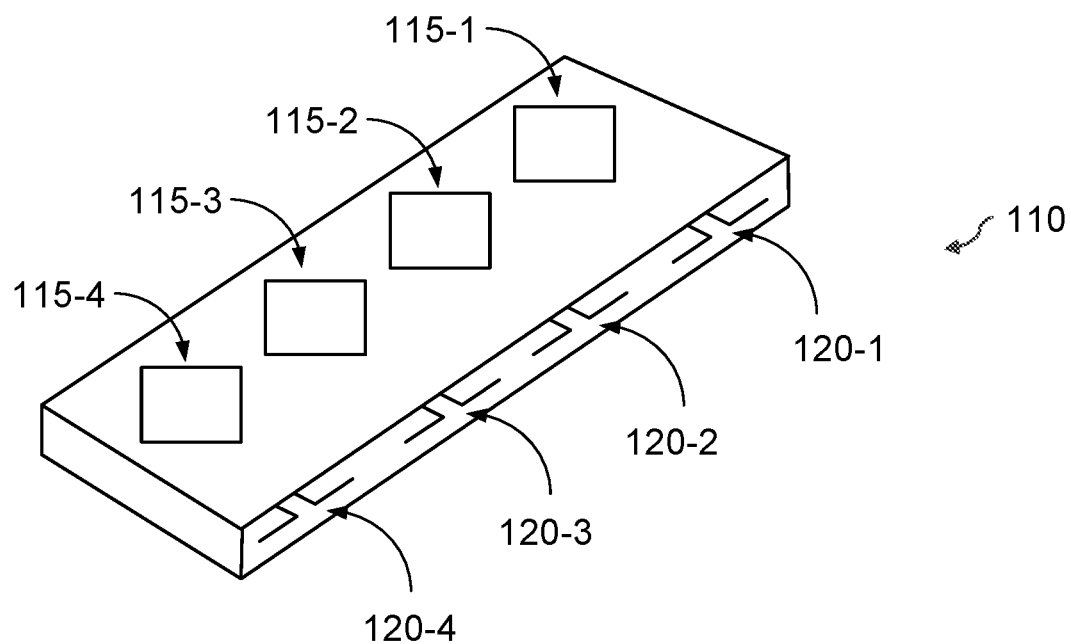
FIG. 1A shows an example of an antenna module including patch antennas and dipole antennas according to certain aspects of the present disclosure.

One or more antenna arrays may be integrated on an antenna module that is incorporated in a wireless device. In this regard, FIG. 1A shows one example of an antenna module 110 according to certain aspects. In this example, the antenna module 110 includes an array of patch antennas 115-1 to 115-4 and an array of dipole antennas 120-1 to 120-4.

Figure 1B:
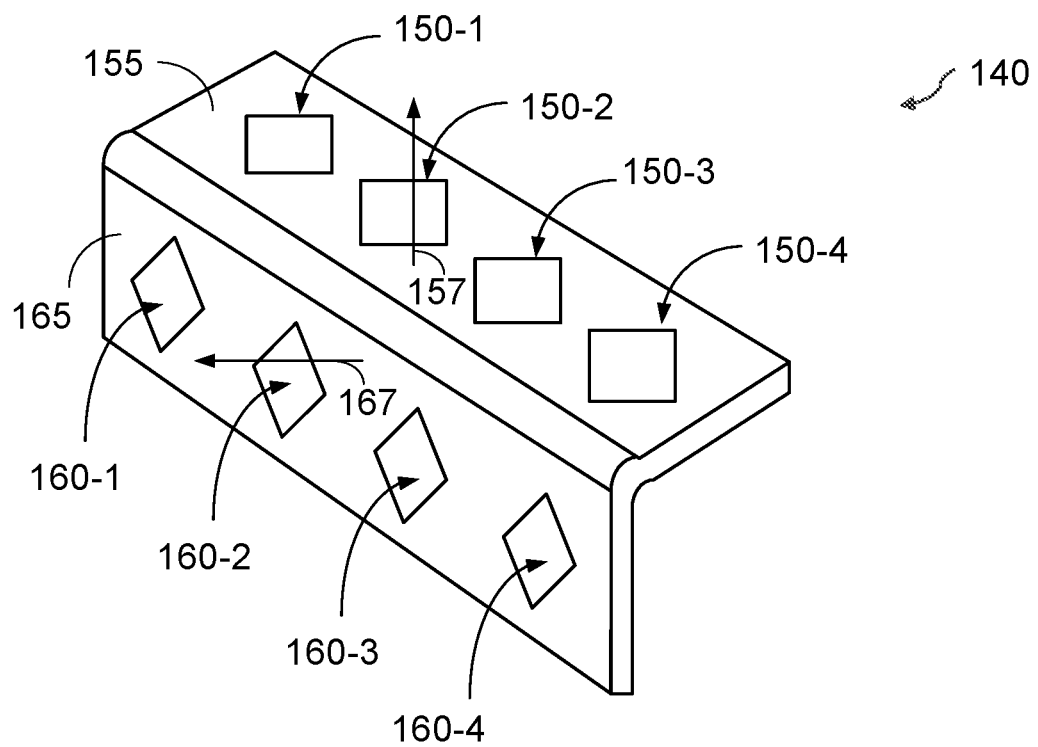
FIG. 1B shows an example of an L-shaped antenna module according to certain aspects of the present disclosure.

FIG. 1B shows an example of an L-shaped antenna module 140 including a first array of antennas 150-1 to 150-4 and a second array of antennas 160-1 to 160-4 facing different directions. The L-shaped antenna module 140 may be incorporated in a wireless device, for example, to transmit and/or receive RF signals on different sides of the wireless device. In one example, the first array of antennas 150-1 to 150-4 is on a first surface 155 (e.g., first planar surface) of the module 140, and the second array of antennas 160-1 to 160-4 is on a second surface 165 (e.g., second planar surface) of the module 140. In the example in FIG. 1B, the first surface 155 and the second surface 165 face different directions in which the direction of the first surface 155 is represented by a vector 157 normal to the first surface 155 and the direction of the second surface 165 is represented by a second vector 167 normal to the second surface 165. In one example, the first surface 155 and the second surface 165 are orientated approximately perpendicular to each other (as shown in the example in FIG. 1B), although it is to be appreciated that this need not be the case. Each of the antennas 150-1 to 150-4 and 160-1 to 160-4 may include a patch antenna or another type of antenna.

Figure 1C:
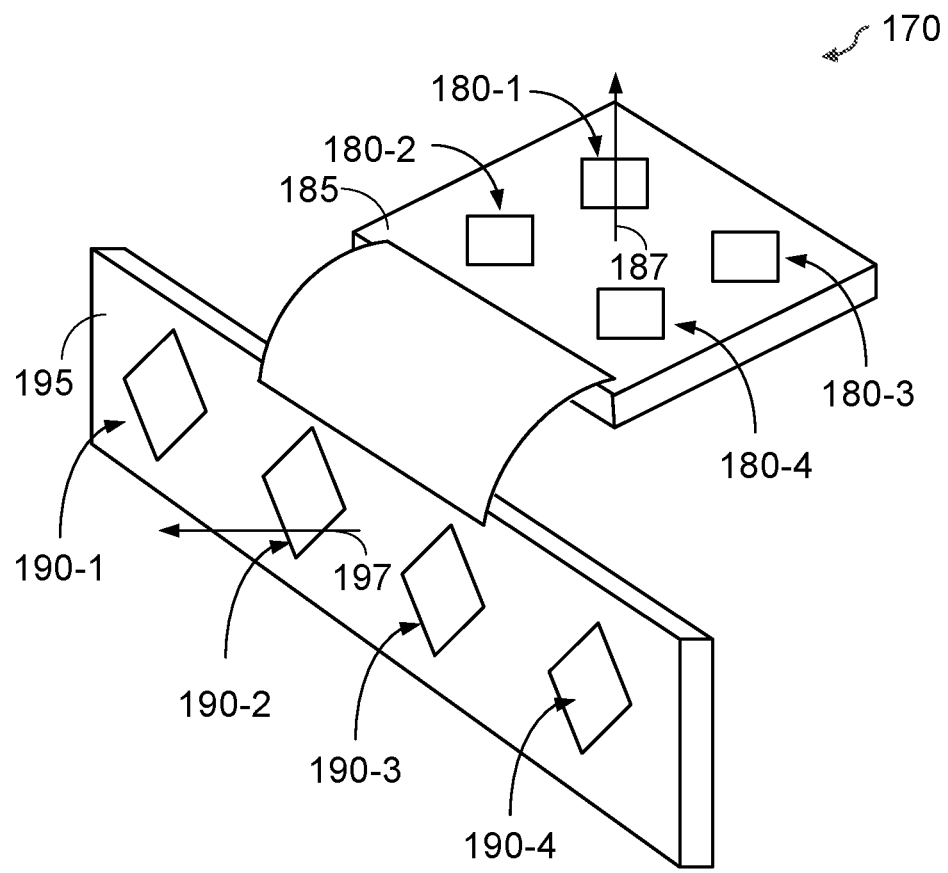
FIG. 1C shows an example of a T-shaped antenna module according to certain aspects of the present disclosure.

FIG. 1C shows an example of a T-shaped antenna module 170 including a first array of antennas 180-1 to 180-4 and a second array of antennas 190-1 to 190-4 facing different directions. In one example, the first array of antennas 180-1 to 180-4 is on a first surface 185 (e.g., first planar surface) of the module 170, and the second array of antennas 190-1 to 190-4 is on a second surface 195 (e.g., second planar surface) of the module 170. In the example in FIG. 1C, the first surface 185 and the second surface 195 face different directions in which the direction of the first surface 185 is represented by a vector 187 normal to the first surface 185 and the direction of the second surface 195 is represented by a second vector 197 normal to the second surface 195. In one example, the first surface 185 and the second surface 195 are orientated approximately perpendicular to each other, although it is to be appreciated that this need not be the case. Each of the antennas 180-1 to 180-4 and 190-1 to 190-4 may include a patch antenna or another type of antenna.

It is to be appreciated that the present disclosure is not limited to the exemplary antenna modules 110, 140, and 170 shown in FIGS. 1A to 1C. In this regard, it is to be appreciated that antenna modules may come in various shapes and that antennas may be arranged in various arrangements on an antenna module.

Antennas in an antenna array may be coupled to transmit chains for transmitting RF signals via the antennas and receive chains for receiving RF signals via the antennas. The transmit chains may include mixers for frequency up-conversion and power amplifiers, and the receive chains may include low-noise amplifiers (LNAs) and mixers for frequency down-conversion.

Figure 2:
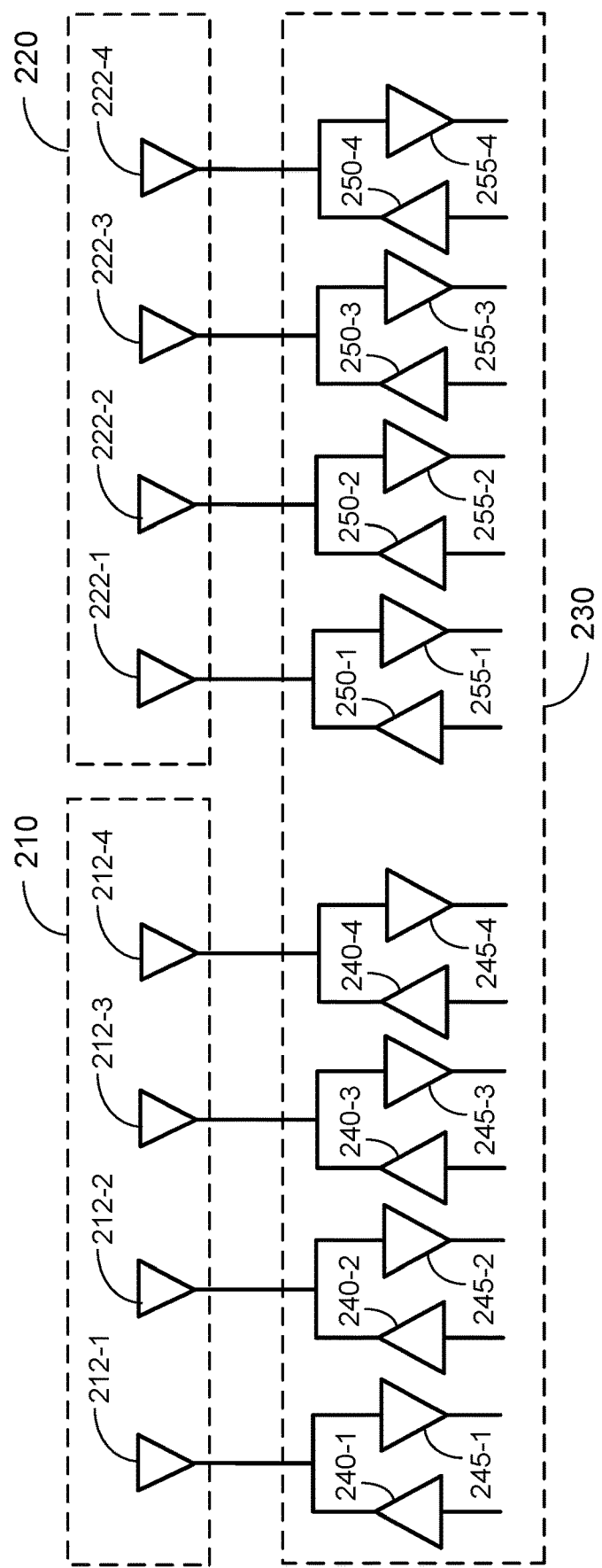
FIG. 2 shows an example of two antenna arrays including antennas coupled to amplifiers according to certain aspects of the present disclosure.

FIG. 2 shows an example of a first antenna array 210 and a second antenna array 220 according to certain aspects. The antenna arrays 210 and 220 may be on the same antenna module (e.g., antenna module 110, 140, or 170) or separate antenna modules. The first antenna array 210 includes antennas 212-1 to 212-4 and the second antenna array 220 includes antennas 222-1 to 222-4. Although each antenna array 210 and 220 includes four antennas in the example shown in FIG. 2, it is to be appreciated that each antenna array 210 and 220 may include a different number of antennas.

In this example, each of the antennas 212-1 to 212-4 in the first antenna array 210 is coupled to a respective power amplifier 240-1 to 240-4 and a respective LNA 245-1 to 245-4 in a transceiver 230. Also, each of the antennas 222-1 to 222-4 in the second antenna array 220 is coupled to a respective power amplifier 250-1 to 250-4 and a respective LNA 255-1 to 255-4 in the transceiver 230. Thus, in this example, the transceiver 230 includes a separate power amplifier 240-1 to 240-4 and 250-1 to 250-4 for each antenna 212-1 to 212-4 and 222-1 to 222-4 and a separate LNA 245-1 to 245-4 and 255-1 to 255-4 for each antenna 212-1 to 212-4 and 222-1 to 222-4. For the example where each power amplifier 240-1 to 240-4 and 250-1 to 250-4 is part of a respective transmit chain and each LNA 245-1 to 245-4 and 255-1 to 255 is part of respective receive chain, the transceiver 230 includes a separate transmit chain for each antenna 212-1 to 212-4 and 222-1 to 222-4 and a separate receive chain for each antenna 212-1 to 212-4 and 222-1 to 222-4. Thus, in this example, transmit and receive circuitry is replicated for each antenna 212-1 to 212-4 and 222-1 to 222-4 in the antenna arrays 210 and 220, increasing the cost and area of the transceiver 230.

Figure 3A:
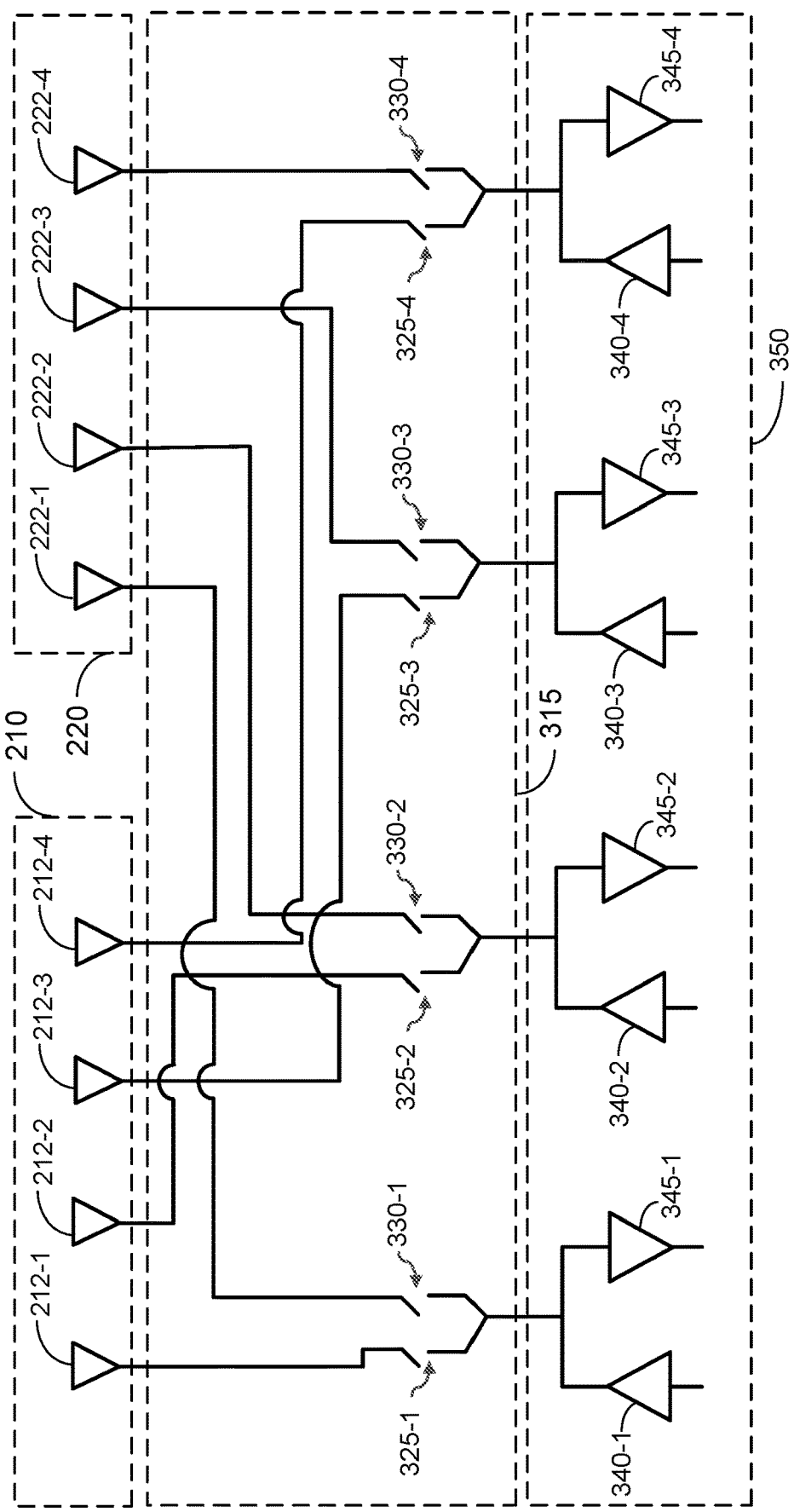
FIG. 3A shows an example of a switching circuit configured to selectively couple antennas in two antenna arrays to amplifiers according to certain aspects of the present disclosure.

In applications where one of the antenna arrays 210 and 220 is active at a time, the antennas 212-1 to 212-4 in the first antenna array 210 and the antennas 222-1 to 222-4 in the second antenna array 220 may share transmit and receive circuitry to reduce the cost and area of the transceiver. In this regard, FIG. 3A shows an example in which the wireless device includes a switching circuit 315 between the antenna arrays 210 and 220 and the transceiver 350. As discussed further below, the switching circuit 315 allows the antennas 212-1 to 212-4 in the first antenna array 210 and the antennas 222-1 to 222-4 in the second antenna array 220 to share transmit and receive circuitry in the transceiver 350, thereby reducing the cost and area of the transceiver 350 compared with the transceiver 230 in FIG. 2.

In this example, the transceiver 350 includes power amplifiers 340-1 to 340-4 where each power amplifier 340-1 to 340-4 is shared by a respective one of the antennas 212-1 to 212-4 in the first antenna array 210 and a respective one of the antennas 222-1 to 222-4 in the second antenna array 220. The transceiver 350 also includes LNAs 345-1 to 345-4 where each LNA 345-1 to 345-4 is shared by a respective one of the antennas 212-1 to 212-4 in the first antenna array 210 and a respective one of the antennas 222-1 to 222-4 in the second antenna array 220.

The switching circuit 315 includes first switches 325-1 to 325-4 and second switches 330-1 to 330-4. Each of the first switches 325-1 to 325-4 is coupled between a respective one of the antennas 212-1 to 212-4 in the first antenna array 210 and the respective power amplifier 340-1 to 340-4. Each of the first switches 325-1 to 325-4 is also coupled between the respective one of the antennas 212-1 to 212-4 in the first antenna array 210 and the respective LNA 345-1 to 345-4. Each of the second switches 330-1 to 330-4 is coupled between a respective one of the antennas 222-1 to 222-4 in the second antenna array 220 and the respective power amplifier 340-1 to 340-4. Each of the second switches 330-1 to 330-4 is also coupled between the respective one of the antennas 222-1 to 222-4 in the second antenna array 220 and the respective LNA 345-1 to 345-4.

In this example, when the first antenna array 210 is active and the second antenna array 220 is inactive, the first switches 325-1 to 325-4 are turned on (i.e., closed) and the second switches 330-1 to 330-4 are turned off (i.e., open). As a result, the antennas 212-1 to 212-4 in the first antenna array 210 are coupled to the respective power amplifiers 340-1 to 340-4 and LNAs 345-1 to 345-4. When the second antenna array 220 is active and the first antenna array 210 is inactive, the second switches 330-1 to 330-4 are turned on (i.e., closed) and the first switches 325-1 to 325-4 are turned off (i.e., open). As a result, the antennas 222-1 to 222-4 in the second antenna array 220 are coupled to the respective power amplifiers 340-1 to 340-4 and LNAs 345-1 to 345-4.

Thus, the switching circuit 315 couples the antennas 212-1 to 212-4 in the first antenna array 210 to the respective power amplifiers 340-1 to 340-4 and LNAs 345-1 to 345-4 when the first antenna array 210 is active, and couples the antennas 222-1 to 222-4 in the second antenna array 220 to the respective power amplifiers 340-1 to 340-4 and LNAs 345-1 to 345-4 when the second antenna array 220 is active. In this manner, the switching circuit 315 allows the antennas 212-1 to 212-4 in the first antenna array 210 and the antennas 222-1 to 222-4 in the second antenna array 220 to share the power amplifiers 340-1 to 340-4 and LNAs 345-1 to 345-4 in the transceiver 350, thereby reducing the cost and area of the transceiver 350 compared with the transceiver 230 in FIG. 2.

Figure 3C:
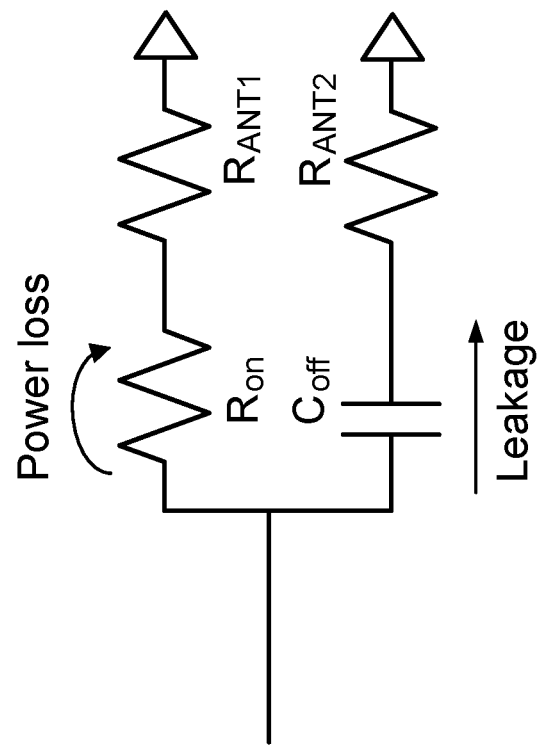
FIG. 3C illustrates power loss in one of the two switches and leakage in the other one of the two switches during operation according to certain aspects of the present disclosure.
Figure 3B:
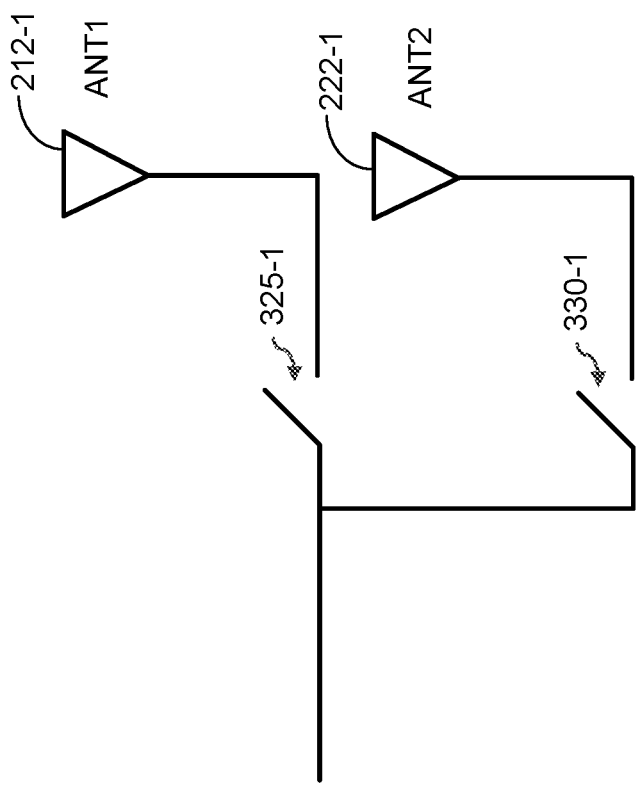
FIG. 3B shows an example of two switches in the switching circuit configured to couple one of two antennas to an amplifier at a time according to certain aspects of the present disclosure.

However, the switching circuit 315 reduces the performance of the transceiver 350 and the antenna arrays 210 and 220. This can be demonstrated with reference to FIGS. 3B and 3C. FIG. 3B shows a closeup of switches 325-1 and 330-1 in the switching circuit 315, antenna 212-1 in the first antenna array 210, and antenna 222-1 in the second antenna array 220. In this example, switch 325-1 is turned on and switch 330-1 is turned off when the first antenna array 210 is active, and switch 330-1 is turned on and switch 325-1 is turned off when the second antenna array 220 is active.

Each of the switches 325-1 and 330-1 has an on resistance (denoted "$R_{on}$") when turned on that results in a power loss across the switch 325-1 and 330-1 that is proportional to the on resistance $R_{on}$. The on resistance $R_{on}$ of each switch 325-1 and 330-1 may be decreased by increasing the size of each switch 325-1 and 330-1. Thus, the power loss across each switch 325-1 and 330-1 may be decreased by increasing the size of each switch 325-1 and 330-1. FIG. 3C shows an example of the resistance $R_{on}$ of switch 325-1 for the case where switch 325-1 is turned on (i.e., antenna 212-1 is active).

Each of the switches 325-1 and 330-1 also has an off capacitance (denoted "$C_{off}$") when turned off that results in leakage through the switch 325-1 and 330-1 that is proportional to the off capacitance $C_{off}$. Because of the leakage, the active antenna is not completely isolated from the inactive antenna, leading to cross-talk between the antennas 212-1 and 222-1. FIG. 3C shows an example of the off capacitance $C_{off}$ of switch 330-1 for the case where switch 330-1 is turned off (i.e., antenna 222-1 is inactive). FIG. 3C also shows the resistance of antenna 212-1 (denoted "$R_{ANT1}$") and the resistance of antenna 222-1 (denoted "$R_{ANT2}$").

For a given process, the product of the on resistance $R_{on}$ and the off capacitance $C_{off}$ of each switch 325-1 and 330-1 may be approximately constant. Thus, decreasing the on resistance $R_{on}$ of each switch 325-1 and 330-1 to reduce power loss, increases the off capacitance $C_{off}$ of each switch 325-1 and 330-1, which increases leakage and thus reduces isolation between the antennas 212-1 and 222-1. In other words, there is a tradeoff between power loss and antennato-antenna isolation in this example. This tradeoff makes it difficult for the switching circuit 315 to achieve both low power loss and high antenna-to-antenna isolation.

Figure 4:
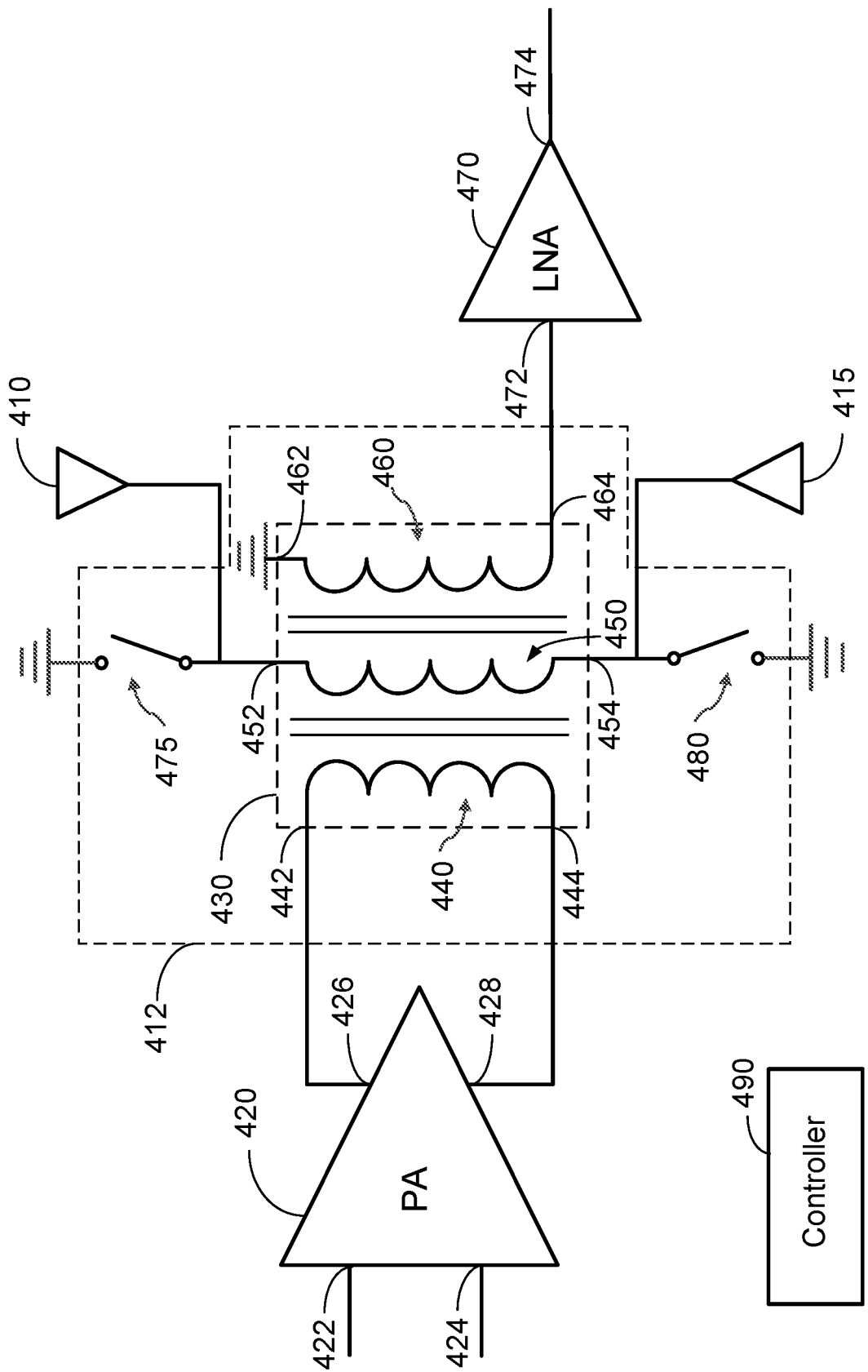
FIG. 4 shows an example of a switching circuit including a tri-coil transformer for switching between two antennas according to certain aspects of the present disclosure.

FIG. 4 shows an exemplary switching circuit 412 according to certain aspects of the present disclosure. The switching circuit 412 allows a first antenna 410 and a second antenna 415 to share a power amplifier 420 and an LNA 470. Thus, the switching circuit 412 reduces cost and area compared with the transceiver 230 in FIG. 2, in which transmit and receive circuitry is replicated for each antenna. Also, the switching circuit 412 does not suffer from the tradeoff between power loss and antenna-to-antenna isolation that limits the performance of the switching circuit 315 in FIG. 3A. This allows the switching circuit 412 to achieve low power loss and high antenna-to-antenna isolation, as discussed further below.

In the example in FIG. 4, the switching circuit 412 is configured to switch between the first antenna 410 and the second antenna 415 depending on which one of the antennas 410 and 415 is active at a given time. The first antenna 410 may correspond to one of the antennas 212-1 to 212-4 in the first antenna array 210, and the second antenna 415 may correspond to one of the antennas 222-1 to 222-4 in the second antenna array 220. The antennas 410 and 415 may be on the same antenna module (e.g., antenna module 110, 140, or 170) or separate antenna modules. The switching circuit 412 may be coupled to the antennas 410 and 415 via respective transmission lines.

In this example, the switching circuit 412 includes a tri-coil transformer 430 including a first inductor 440, a second inductor 450, and a third inductor 460. The second inductor 450 is magnetically coupled to the first inductor 440 and the third inductor 460. Each of the inductors 440, 450 and 460 may be implemented with a coil inductor, a spiral inductor, a loop inductor, a slab inductor, or another type of inductor.

In the example in FIG. 4, the power amplifier 420 is a differential power amplifier having a differential input and a differential output, in which the differential input includes a first input 422 and a second input 424, and the differential output includes a first output 426 and a second output 428. In this example, the power amplifier 420 is configured to receive a differential RF signal, amplify the differential RF signal, and output the amplified differential RF signal at the differential output. However, it is to be appreciated that the power amplifier 420 is not limited to a differential power amplifier. In certain aspects, the power amplifier 420 may be implemented with two or more amplifiers.

In the example in FIG. 4, the first inductor 440 of the transformer 430 is coupled between the first output 426 and the second output 428 of the power amplifier 420. More particularly, a first terminal 442 of the first inductor 440 is coupled to the first output 426 of the power amplifier 420, and a second terminal 444 of the first inductor 440 is coupled to the second output 428 of the power amplifier 420.

The second inductor 450 of the transformer 430 is coupled to the antennas 410 and 415. More particularly, a first terminal 452 of the second inductor 450 is coupled to the first antenna 410, and a second terminal 454 of the second inductor 450 is coupled to the second antenna 415.

The third inductor 460 of the transformer 430 is coupled to the LNA 470. More particularly, a first terminal 462 of the third inductor 460 is coupled to ground or a bias control circuit (not shown), and a second terminal 464 of the third inductor 460 is coupled to an input 472 of the LNA 470.

The switching circuit 412 also includes a first switch 475 and a second switch 480. The first switch 475 is coupled between the first terminal 452 of the second inductor 450 and ground, and the second switch 480 is coupled between the second terminal 454 of the second inductor 450 and ground. Each of the switches 475 and 480 may be implemented with one or more n-type field effect transistors (NFETs), one or more p-type field effect transistors (PFETs), a transmission gate, or another type of switch. In some implementations, each of the switches 475 and 480 may be implemented with two or more stacked transistors, which allow the switch to tolerate a higher voltage by splitting the voltage between the stacked transistors.

In operation, a controller 490 switches the switching circuit 412 to a first antenna mode when the first antenna 410 is active and switches the switching circuit 412 to a second antenna mode when the second antenna 415 is active.

In the first antenna mode, the controller 490 turns on (i.e., closes) the second switch 480 and turns off (i.e., opens) the first switch 475. In this mode, the second switch 480 pulls the second antenna 415 to ground. By pulling the second antenna 415 to ground, the second switch 480 isolates the second antenna 415 (which is inactive in the first antenna mode) from the first antenna 410 (which is active in the first antenna mode). In this example, decreasing the on resistance $R_{on}$ of the second switch 480 decreases power loss across the second switch 480. In addition, decreasing the on resistance $R_{on}$ of the second switch 480 helps the second switch 480 pull the second antenna 415 to ground for better isolation between the second antenna 415 and the first antenna 410.

In the second antenna mode, the controller 490 turns on (i.e., closes) the first switch 475 and turns off (i.e., opens) the second switch 480. In this mode, the first switch 475 pulls the first antenna 410 to ground. By pulling the first antenna 410 to ground, the first switch 475 isolates the first antenna 410 (which is inactive in the second antenna mode) from the second antenna 415 (which is active in the second antenna mode). In this example, decreasing the on resistance $R_{on}$ of the first switch 475 decreases power loss across the first switch 475. In addition, decreasing the on resistance $R_{on}$ of the first switch 475 helps the first switch 475 pull the first antenna 410 to ground for better isolation between the second antenna 415 and the first antenna 410.

Thus, decreasing the on resistance $R_{on}$ of each of the first and second switches 475 and 480 improves both power loss and antenna-to-antenna isolation. This allows the switching circuit 412 to achieve both low power loss and high antenna-to-antenna isolation. In contrast, in the switching circuit 315 in FIG. 3A, there is a tradeoff between power loss and antenna-to-antenna isolation, which makes it difficult for the switching circuit 315 to achieve both low power loss and high antenna-to-antenna isolation.

The first antenna 410 may be used for transmission or reception in the first antenna mode. For transmission in the first antenna mode, the power amplifier 420 drives the first inductor 440 of the transformer 430 with an amplified differential RF signal. The transformer 430 transfers the power of the amplified RF differential signal from the first inductor 440 to the second inductor 450 via magnetic coupling. In addition, the transformer 430 converts the differential RF signal at the first inductor 440 into a single-ended RF signal at the second inductor 450. The single-ended RF signal is then transmitted via the first antenna 410 (which is active in the first antenna mode).

For reception in the first antenna mode, the first antenna 410 receives an RF signal. The transformer 430 transfers the power of the received RF signal from the second inductor 450 to the third inductor 460 via magnetic coupling. The RF signal is then input to the input 472 of the LNA 470 from the third inductor 460. The LNA 470 amplifies the received RF signal and outputs the amplified RF signal at the output 474 of the LNA 470. The output 474 of the LNA 470 may be coupled to a mixer (not shown) or another component in the respective receive chain.

The second antenna 415 may be used for transmission or reception in the second antenna mode. For transmission in the second antenna mode, the power amplifier 420 drives the first inductor 440 of the transformer 430 with an amplified differential RF signal. The transformer 430 transfers the power of the amplified RF differential signal from the first inductor 440 to the second inductor 450 via magnetic coupling, and converts the differential RF signal at the first inductor 440 into a single-ended RF signal at the second inductor 450. The single-ended RF signal is then transmitted via the second antenna 415 (which is active in the second antenna mode).

For reception in the second antenna mode, the second antenna 415 receives an RF signal. The transformer 430 transfers the power of the received RF signal from the second inductor 450 to the third inductor 460 via magnetic coupling. The RF signal is then input to the input 472 of the LNA 470, which amplifies the received RF signal and outputs the amplified RF signal at the output 474 of the LNA 470.

The third inductor 460 in the transformer 430 advantageously allows the first antenna 410 and the second antenna 415 to share the LNA 470. In an approach that does not include the third inductor 460, two LNAs are used for the antennas 410 and 415, in which one of the LNAs is coupled to the first terminal 452 of the second inductor 450 and the other one of the LNAs is coupled to the second terminal 454 of the second inductor 450. In this approach, the LNA coupled to the first terminal 452 is used to amplify signals received by the second antenna 415, and the LNA coupled to the second terminal 454 is used to amplify signals received by the first antenna 410. A drawback of this approach is that the LNAs load the antennas 410 and 415 and the second inductor 450 with parasitic loading, which may degrade performance.

In contrast to the above approach, the third inductor 460 in the transformer 430 allows the switching circuit 412 to use a common LNA 470 for the first antenna 410 and the second antenna 415 instead of two LNAs, which reduces area. In addition, the third inductor 460 avoids the parasitic loading from the two LNAs in the above approach.

The transformer 430 may also provide impedance matching between the differential output of the power amplifier 420 and the active antenna, and impedance matching between the input 472 of the LNA 470 and the active antenna. This may be accomplished, for example, by setting the inductances of the first inductor 440, the second inductor 450, and the third inductor 460 to inductance values that result in impedance matching between the differential output of the power amplifier 420 and the active antenna, and impedance matching between the input 472 of the LNA 470 and the active antenna. The inductance values may be determined through computer simulation and/or testing. As discussed above, the first antenna 410 is the active antenna in the first antenna mode and the second antenna 415 is the active antenna in the second antenna mode.

Figure 5:
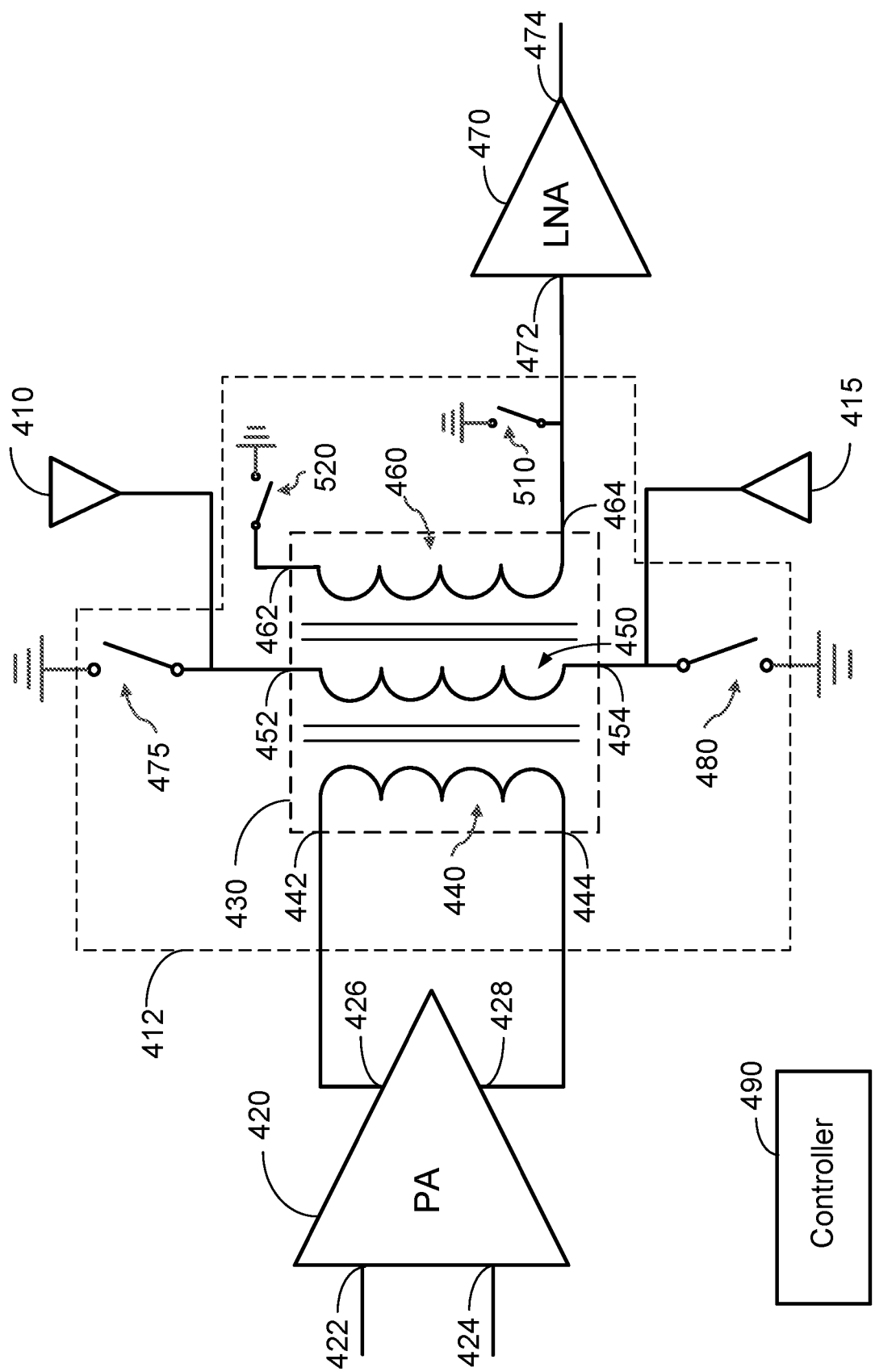
FIG. 5 shows an example of the switching circuit including a switch coupled between the input of an LNA and ground according to certain aspects of the present disclosure.

FIG. 5 shows an example in which the switching circuit 412 also includes a third switch 510 and a fourth switch 520 according to certain aspects. In this example, the third switch 510 is coupled between the input 472 of the LNA 470 and ground, and the fourth switch 520 is coupled between the first terminal 462 of the third inductor 460 and ground.

In this example, the controller 490 operates the switching circuit 412 in a receive mode or a transmit mode based on whether the active antenna is being used for transmission or reception. In the receive mode, the controller 490 turns on (i.e., closes) the fourth switch 520 and turns off (i.e., opens) the third switch 510. In the receive mode, the power of the RF signal received by the active antenna is transferred from the second inductor 450 to the third inductor 460 via magnetic coupling. The received RF signal is then input to the input 472 of the LNA 470 from the third inductor 460.

In the receive mode, the controller 490 may operate the switching circuit 412 in the first antenna mode or the second antenna mode depending on which one of the antennas 410 and 415 is active during reception. If the first antenna 410 is active in the receive mode, the controller 490 turns on the second switch 480 and turns off the first switch 475. If the second antenna 415 is active in the receive mode, the controller 490 turns off the second switch 480 and turns on the first switch 475.

In the transmit mode, the controller 490 turns off (i.e., opens) the fourth switch 520 and turns on (i.e., closes) the third switch 510. The turning off of the fourth switch 520 results in a high impedance at the first terminal 462 of the third inductor 460 (assuming the off resistance of the fourth switch 520 is high). The high impedance at the first terminal 462 causes the impedance at the third inductor 460 to be high in the transmit mode. The high impedance at the third inductor 460 in the transmit mode facilitates the transfer of power of the amplified RF signal from the power amplifier 420 to the second inductor 450 (which has low impedance), and hence the transfer of power of the amplified RF signal to the active antenna. The high impedance also helps isolate the input 472 of the LNA 470 from the output of the power amplifier 420 so that the amplified RF signal is not coupled into the LNA 470 in the transmit mode.

In the transmit mode, the controller 490 may operate the switching circuit 412 in the first antenna mode or the second antenna mode depending on which one of the antennas 410 and 415 is active during transmission. If the first antenna 410 is active in the transmit mode, the controller 490 turns on the second switch 480 and turns off the first switch 475. If the second antenna 415 is active in the transmit mode, the controller 490 turns off the second switch 480 and turns on the first switch 475.

It is to be appreciated that, in some implementations, the switching circuit 412 may include the third switch 510 with the fourth switch 520 omitted, and vice versa. For the example where the fourth switch 520 is omitted, the first terminal 462 of the third inductor 460 may be coupled to ground.

Figure 6:
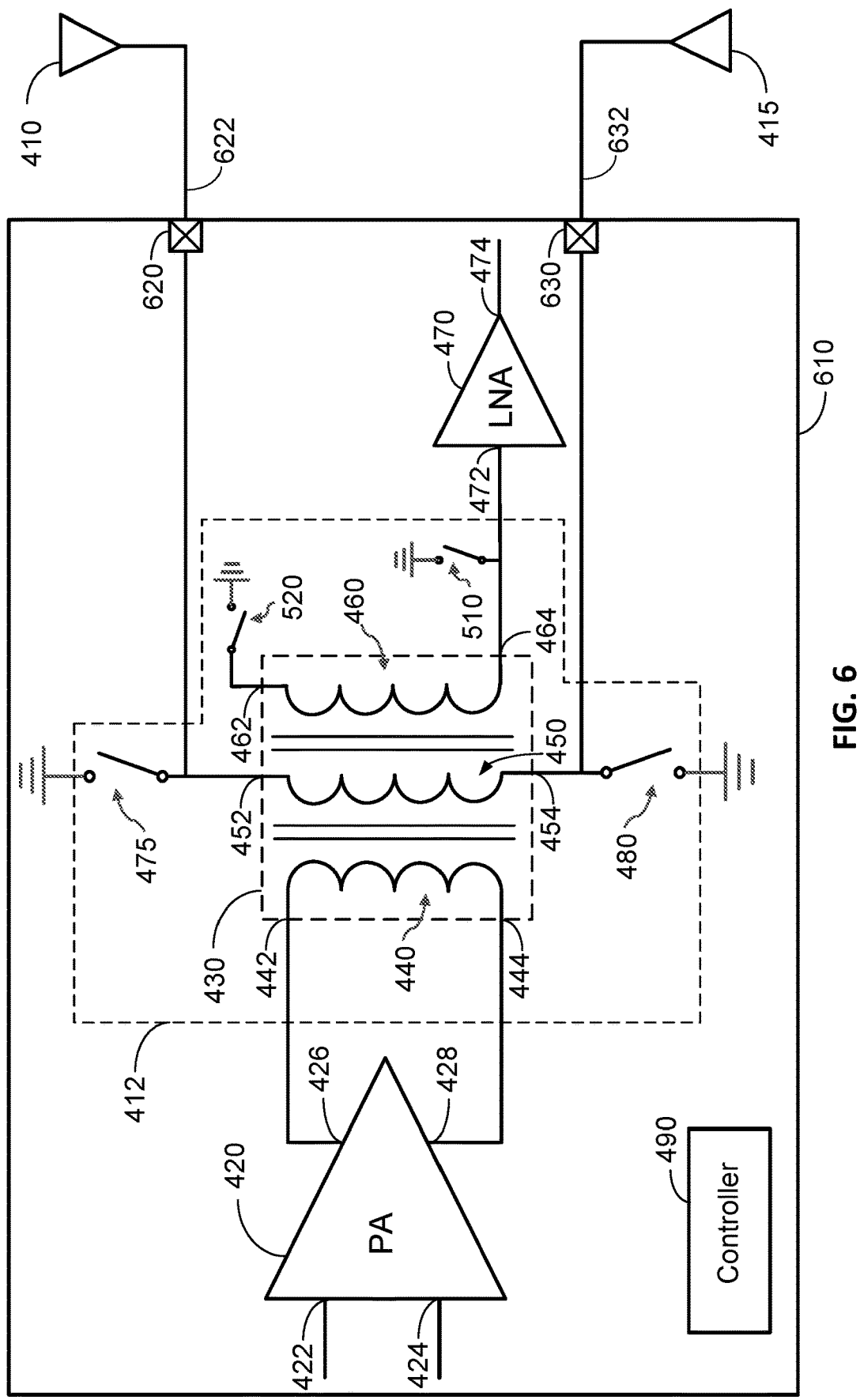
FIG. 6 shows an example in which the switching circuit is integrated on a chip according to certain aspects of the present disclosure.

FIG. 6 shows an example in which the switching circuit 412 is integrated on a chip 610 according to certain aspects of the present disclosure. In this example, the first antenna 410 and the second antenna 415 are external to the chip 610 (i.e., off chip). For example, the first antenna 410 and the second antenna 415 may be integrated on an antenna module (e.g., antenna module 110, 140, or 170) that is separate from the chip 610.

In the example in FIG. 6, the chip 610 includes a first pad 620 (e.g., first bump pad) and a second pad 630 (e.g., second bump pad). The first terminal 452 of the second inductor 450 of the switching circuit 412 is coupled to the first pad 620 (e.g., by one or more metal lines on the chip 610). The first pad 620 is coupled to the first antenna 410 via first a transmission line 622 (e.g., metal line, cable, or another type of transmission line). Thus, in this example, the first terminal 452 of the second inductor 450 of the switching circuit 412 is coupled to the first antenna 410 via the first pad 620.

The second terminal 454 of the second inductor 450 of the switching circuit 412 is coupled to the second pad 630 (e.g., by one or more metal lines on the chip 610). The second pad 630 is coupled to the second antenna 415 via a second transmission line 632 (e.g., metal line, cable, or another type of transmission line). Thus, in this example, the second terminal 454 of the second inductor 450 of the switching circuit 412 is coupled to the second antenna 415 via the second pad 630.

The power amplifier 420 and the LNA 470 may also be integrated on the chip 610, an example of which is shown in FIG. 6. However, it is to be appreciated that the present disclosure is not limited to this example. For example, the power amplifier 420 and/or the LNA 470 may be integrated on another chip in some implementations.

In certain aspects, it may be desirable to provide the switching circuit 412 with electrostatic discharge (ESD) protection. An ESD event may occur, for example, when charge is unintentionally deposited on at least one of the pads 620 and 630 (e.g., during handling of the chip 610). Without ESD protection to discharge the charge, the charge can cause a large potential to appear at the switches 475 and 480, which can damage the switches 475 and 480. An ESD event may also occur, for example, when the chip 610 acquires charge and then discharges to an object making contact with at least one of the pads 620 and 630.

Figure 7:
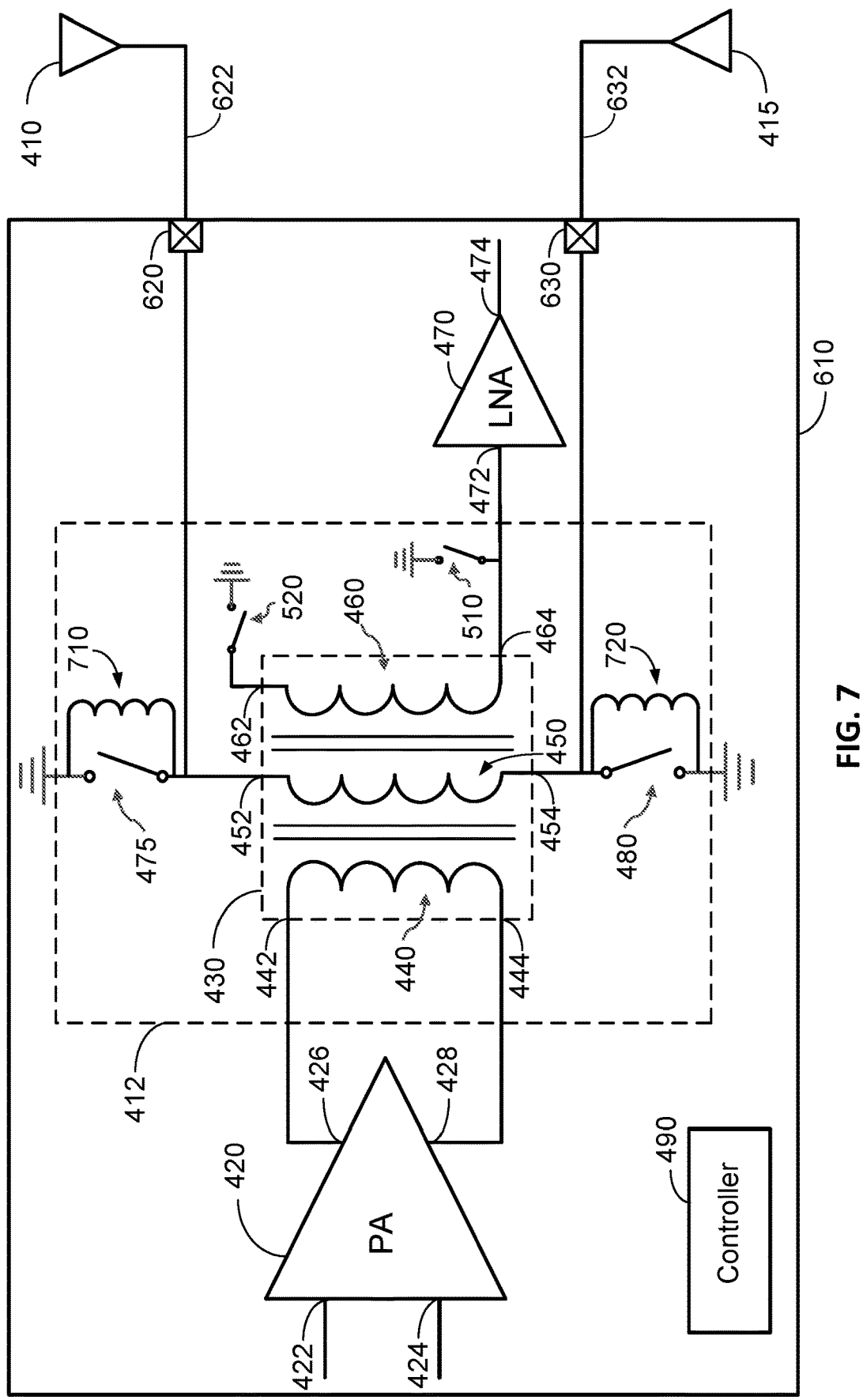
FIG. 7 shows an example of shunt inductors where each shunt inductor is coupled in parallel with a respective switch in the switching circuit to provide electrostatic discharge (ESD) protection according to certain aspects of the present disclosure.

FIG. 7 shows an example in which the switching circuit 412 includes a first shunt inductor 710 and a second shunt inductor 720 to provide ESD protection for the switching circuit 412. In this example, the first shunt inductor 710 is coupled in parallel with the first switch 475, and the second shunt inductor 720 is coupled in parallel with the second switch 480. The inductances of the shunt inductors 710 and 720 may be chosen such that the shunt inductors 710 and 720 have high impedance at the frequencies of the RF signals transmitted and/or received via the antennas 410 and 415, and low impedance for an ESD event. Because the shunt inductors 710 and 720 have low impedance for an ESD event, the shunt inductors 710 and 720 provide a discharge path for the ESD event that prevents ESD damage to the switches 475 and 480.

When the first switch 475 is turned off in the first antenna mode, the first shunt inductor 710 is coupled in parallel with the off capacitance $C_{off}$ of the first switch 475, forming an LC network. In one example, the inductance of the first shunt inductor 710 may be chosen such that the LC network resonates at a frequency (e.g., center frequency) of the RF signal that is transmitted or received via the first antenna 410. As a result, the LC network appears as an open circuit to the RF signal to prevent leakage of the RF signal.

Similarly, when the second switch 480 is turned off in the second antenna mode, the shunt inductor 720 is coupled in parallel with the off capacitance $C_{off}$ of the second switch 480, forming an LC network. In one example, the inductance of the second shunt inductor 720 may be chosen such that the LC network resonates at a frequency (e.g., center frequency) of the RF signal that is transmitted or received via the second antenna 415. As a result, the LC network appears as an open circuit to the RF signal to prevent leakage of the RF signal.

Figure 8:
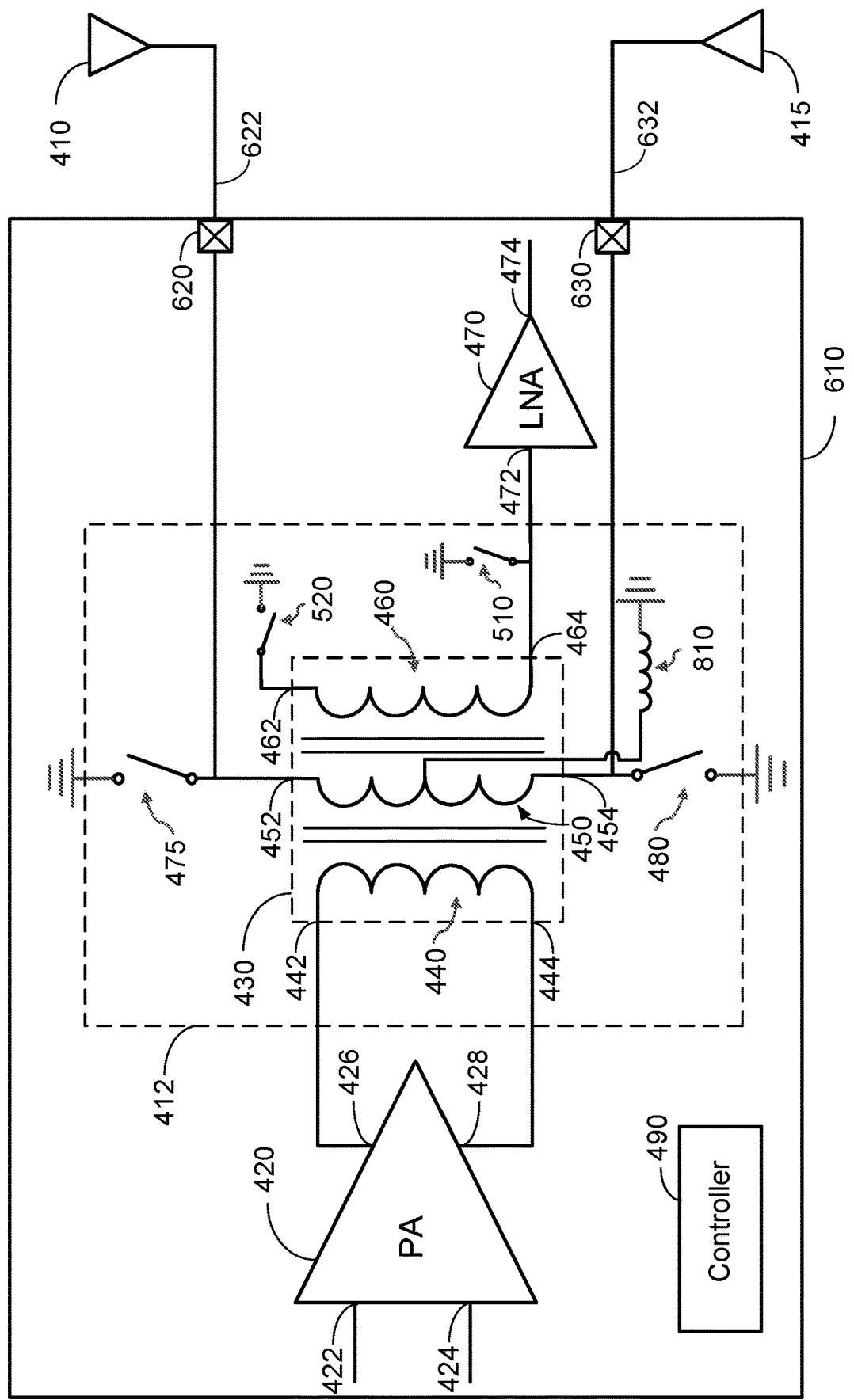
FIG. 8 shows an example of the switching circuit including a shunt inductor to provide ESD protection according to certain aspects of the present disclosure.

FIG. 8 shows another exemplary ESD protection scheme according to certain aspects of the present disclosure. In this example, the switching circuit 412 includes a shunt inductor 820 coupled between a center tap of the second inductor 450 and ground. During an ESD event, the shunt inductor 820 is configured to provide a discharge path from the second inductor 450 to ground.

Figure 9:
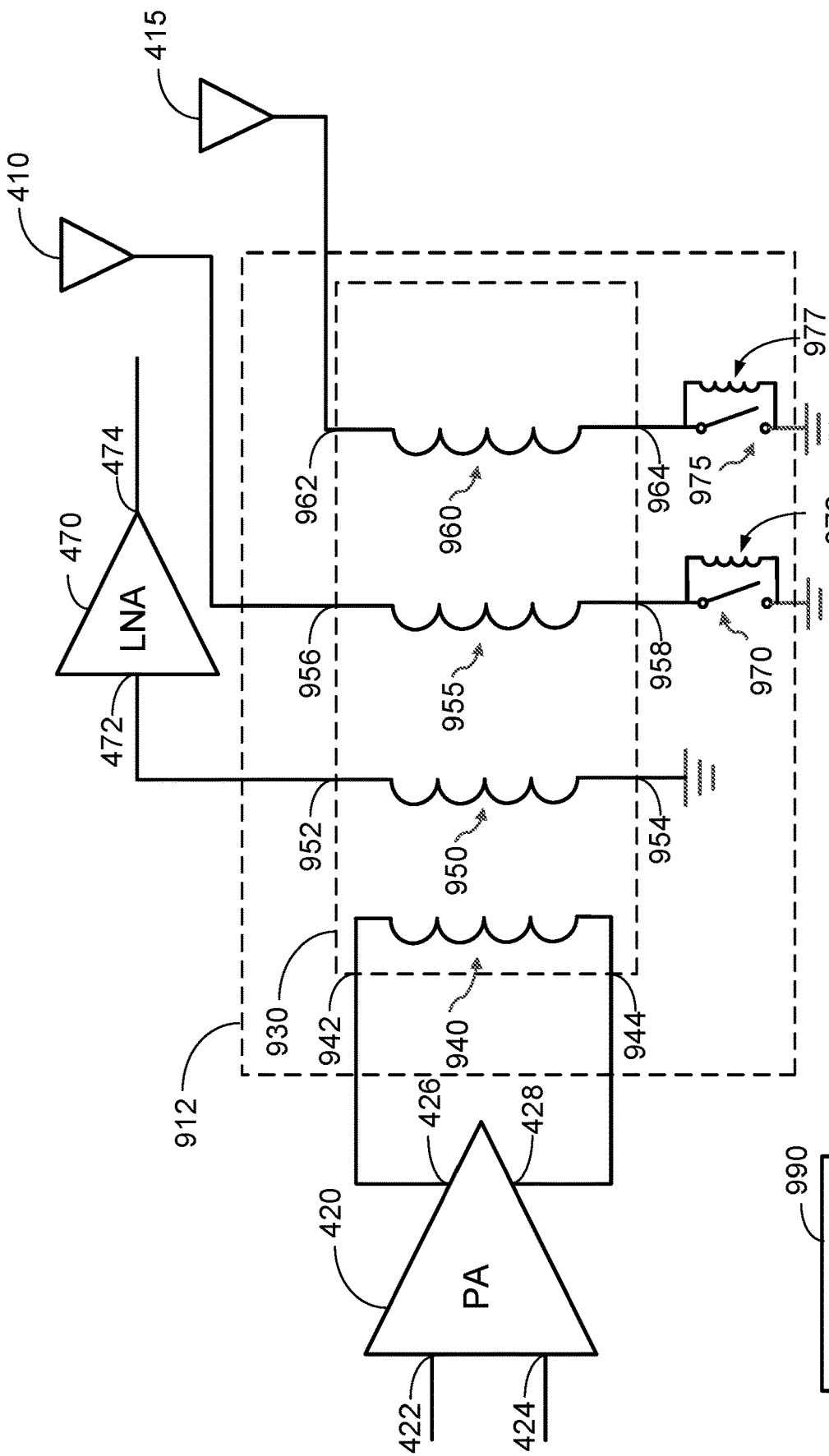
FIG. 9 shows an example of a switching circuit including a quad-coil transformer for switching between two antennas according to certain aspects of the present disclosure.

FIG. 9 shows another exemplary switching circuit 912 according to certain aspects of the present disclosure. The switching circuit 912 allows the first antenna 410 and the second antenna 415 to share the power amplifier 420 and the LNA 470. The switching circuit 912 may be coupled to the antennas 410 and 415 via respective transmission lines.

In this example, the switching circuit 912 includes a quad-coil transformer 930 including a first inductor 940, a second inductor 950, a third inductor 955, and a fourth inductor 960. The third inductor 955 is magnetically coupled to the first inductor 940 and the second inductor 950, and the fourth inductor 960 is magnetically coupled to the first inductor 940 and the second inductor 950. Each of the inductors 940, 950, 955, and 960 may be implemented with a coil inductor, a spiral inductor, a loop inductor, a slab inductor, or another type of inductor.

The switching circuit 912 also includes a first switch 970, a second switch 975, a first shunt inductor 972, and a second shunt inductor 977, each of which is discussed in greater detail below according to certain aspects.

In the example in FIG. 9, the first inductor 940 of the transformer 930 is coupled between the first output 426 and the second output 428 of the power amplifier 420. More particularly, a first terminal 942 of the first inductor 940 is coupled to the first output 426 of the power amplifier 420, and a second terminal 944 of the first inductor 940 is coupled to the second output 428 of the power amplifier 420.

The second inductor 950 of the transformer 930 is coupled to the LNA 470. More particularly, a first terminal 952 of the second inductor 950 is coupled to the input 472 of the LNA 470, and a second terminal 954 of the second inductor 950 is coupled to ground or a bias control circuit (not shown).

The third inductor 955 of the transformer 930 has a first terminal 956 and a second terminal 958. In this example, the first terminal 956 of the third inductor 955 is coupled to the first antenna 410, and the first switch 970 is coupled between the second terminal 958 of the third inductor 955 and ground. The first shunt inductor 972 may be coupled in parallel with the first switch 970 to provide ESD protection, as discussed above.

The fourth inductor 960 of the transformer 930 has a first terminal 962 and a second terminal 964. In this example, the first terminal 962 of the fourth inductor 960 is coupled to the second antenna 415, and the second switch 975 is coupled between the second terminal 964 of the fourth inductor 960 and ground. The second shunt inductor 977 may be coupled in parallel with the second switch 975 to provide ESD protection, as discussed above.

In operation, a controller 990 switches the switching circuit 912 to a first antenna mode when the first antenna 410 is active and switches the switching circuit 412 to a second antenna mode when the second antenna 415 is active.

In the first antenna mode, the controller 990 turns on (i.e., closes) the first switch 970 and turns off the (i.e., opens) the second switch 975. In the first antenna mode, the impedance at the third inductor 955 is low. This is because the first switch 970 is closed and therefore couples the second terminal 958 of the third inductor 955 to ground. Also, in the first antenna mode, the impedance at the fourth inductor 960 is high. This is because the second switch 975 is open and coupled in series with the fourth inductor 960. When the power amplifier 420 drives the first inductor 940 with an RF signal, the low impedance at the third inductor 955 and high impedance at the fourth inductor 960 facilitates the transfer of power of the RF signal from the first inductor 940 to the third inductor 955, which is coupled to the active antenna (i.e., first antenna 410) in the first antenna mode.

In the second antenna mode, the controller 990 turns on (i.e., closes) the second switch 975 and turns off the (i.e., opens) the first switch 970. In the second antenna mode, the impedance at the fourth inductor 960 is low. This is because the second switch 975 is closed and therefore couples the second terminal 964 of the fourth inductor 960 to ground. Also, in the second antenna mode, the impedance at the third inductor 955 is high impedance. This is because the first switch 970 is open and coupled in series with the third inductor 955. When the power amplifier 420 drives the first inductor 940 with an RF signal, the low impedance at the fourth inductor 960 and high impedance at the third inductor 955 facilitates the transfer of power of the RF signal from the first inductor 940 to the fourth inductor 960, which is coupled to the active antenna (i.e., second antenna 415) in the second antenna mode.

Figure 10:
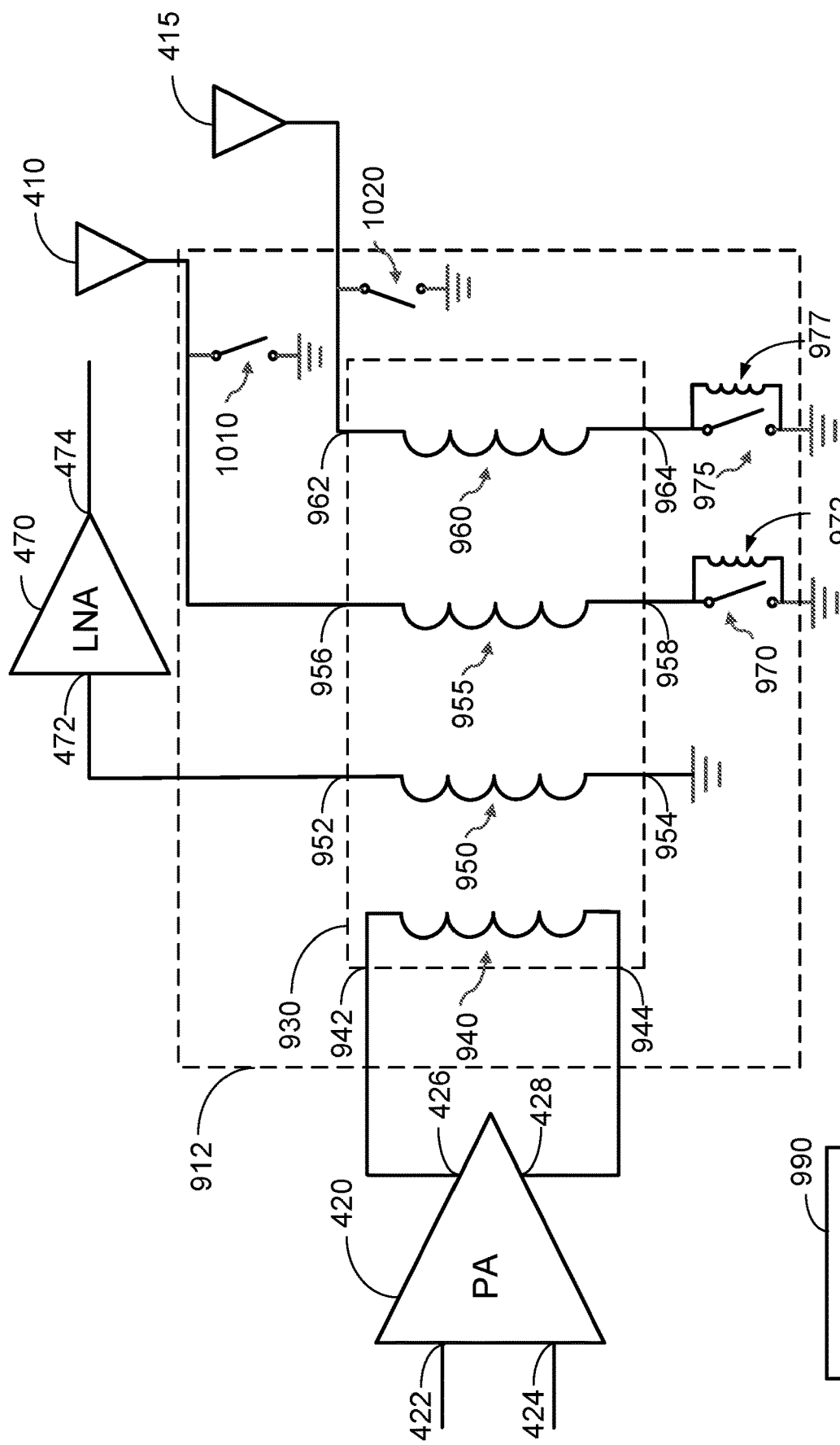
FIG. 10 shows an example of the switching circuit including switches where each switch is coupled between a respective one of the antennas and ground according to certain aspects of the present disclosure.

FIG. 10 shows an example in which the switching circuit 912 also includes a third switch 1010 and a fourth switch 1020 according to certain aspects. In this example, the third switch 1010 is coupled between the first terminal 956 of the third inductor 955 and ground, and the fourth switch 1020 is coupled between the first terminal 962 of the fourth inductor 960 and ground.

In the first antenna mode, the controller 990 turns off the third switch 1010 and turns on the fourth switch 1020. The turning on of the fourth switch 1020 causes the fourth switch 1020 to pull the second antenna 415 to ground. This helps isolate the second antenna 415 (which is inactive in the first antenna mode) from the first antenna 410, and therefore improves antenna-to-antenna isolation in the first antenna mode.

In the second antenna mode, the controller 990 turns off the fourth switch 1020 and turns on the third switch 1010. The turning on of the third switch 1010 causes the third switch 1010 to pull the first antenna 410 to ground. This helps isolate the first antenna 410 (which is inactive in the second antenna mode) from the second antenna 415, and therefore improves antenna-to-antenna isolation in the second antenna mode.

It is to be appreciated that, in some implementations, the switching circuit 912 may include the third switch 1010 and the fourth switch 1020 with the first switch 970 and the second switch 975 omitted.

Figure 11:
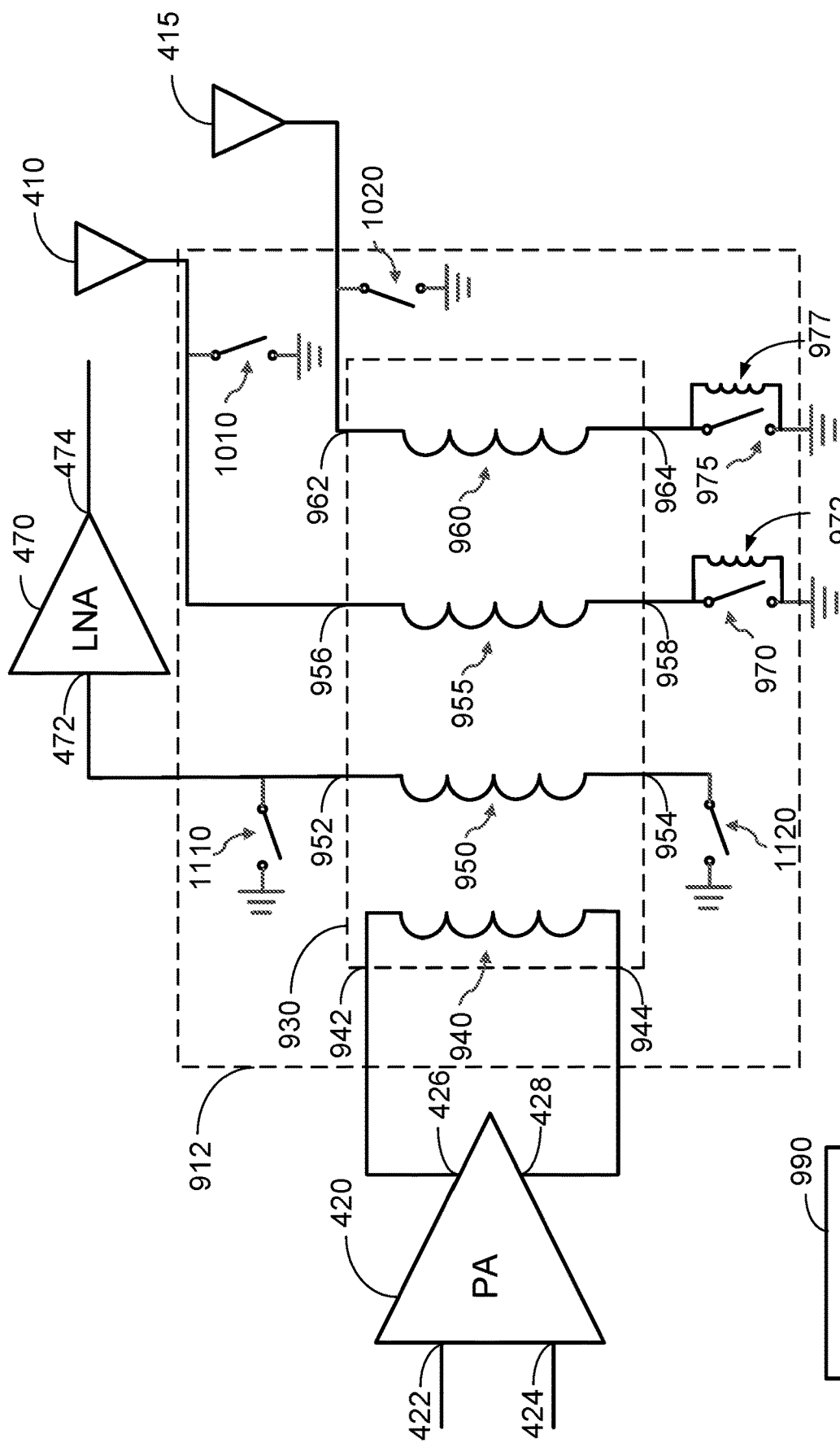
FIG. 11 shows an example of the switching circuit including a switch coupled between the input of an LNA and ground according to certain aspects of the present disclosure.

FIG. 11 shows an example in which the switching circuit 912 also includes a fifth switch 1110 and a sixth switch 1120 according to certain aspects. In this example, the fifth switch 1110 is coupled between the input 472 of the LNA 470 and ground, and the sixth switch 1120 is coupled between the second terminal 954 of the second inductor 950 and ground.

In this example, the controller 990 operates the switching circuit 912 in a receive mode or a transmit mode based on whether the active antenna is being used for transmission or reception. In the receive mode, the controller 990 turns on (i.e., closes) the sixth switch 1120 and turns off (i.e., opens) the fifth switch 1110. In the receive mode, the power of the RF signal received by the active antenna is transferred from the third inductor 955 or the fourth inductor 960 to the second inductor 950 via magnetic coupling. The received RF signal is then input to the input 472 of the LNA 470 from the second inductor 950. In the receive mode, the controller 990 may operate the switching circuit 912 in the first antenna mode or the second antenna mode depending on which one of the antennas 410 and 415 is active during reception.

In the transmit mode, the controller 990 turns off (i.e., opens) the sixth switch 1120 and turns on (i.e., closes) the fifth switch 1110. The turning on of the fifth switch 1110 causes the fifth switch 1110 to pull the input 472 of the LNA 470 to ground, which disables the LNA 470. The turning off of the sixth switch 1120 results in a high impedance at the second terminal 954 of the second inductor 950. The high impedance at the second terminal 954 causes the impedance at the second inductor 950 to be high in the transmit mode. The high impedance at the second inductor 950 in the transmit mode facilitates the transfer of power of the amplified RF signal from the power amplifier 420 to the third inductor 955 in the first antenna node and the transfer of power of the amplified RF signal from the power amplifier 420 to the fourth inductor 960 in the second antenna node. The high impedance also helps isolate the input 472 of the LNA 470 from the output of the power amplifier 420 so that the amplified RF signal is not coupled into the LNA 470 in the transmit mode. In the transmit mode, the controller 990 may operate the switching circuit 912 in the first antenna mode or the second antenna mode depending on which one of the antennas 410 and 415 is active during transmission.

It is to be appreciated that, in some implementations, the switching circuit 912 may include the fifth switch 1110 with the sixth switch 1120 omitted, and vice versa. For the example where the sixth switch 1120 is omitted, the second terminal 954 of the second inductor 950 may be coupled to ground.

Figure 12:
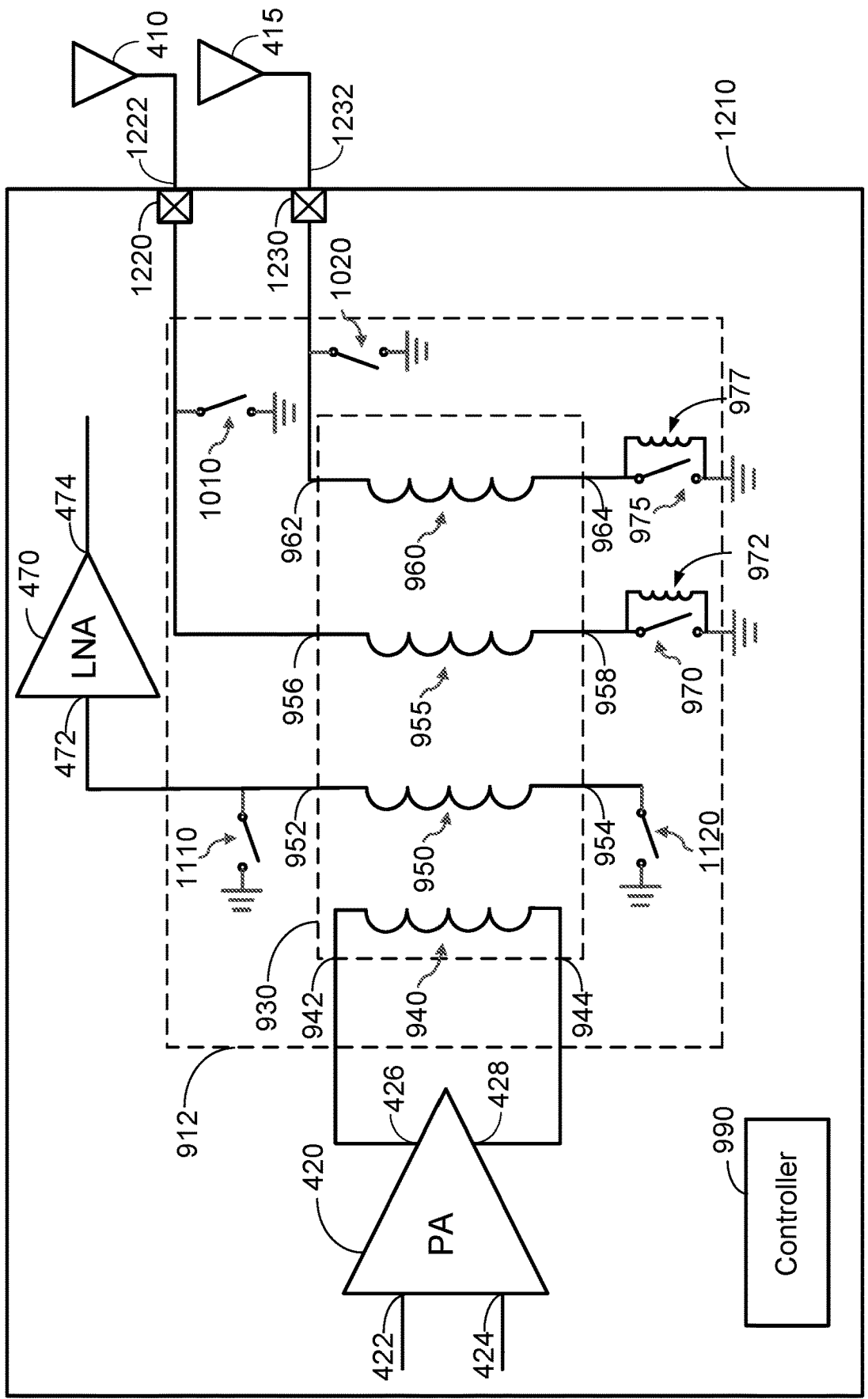
FIG. 12 shows an example in which the switching circuit is integrated on a chip according to certain aspects of the present disclosure.

FIG. 12 shows an example in which the switching circuit 912 is integrated on a chip 1210 according to certain aspects of the present disclosure. In this example, the first antenna 410 and the second antenna 415 are external to the chip 1210 (i.e., off chip). For example, the first antenna 410 and the second antenna 415 may be integrated on an antenna module (e.g., antenna module 110, 140, or 170) that is separate from the chip 1210.

In the example in FIG. 12, the chip 1210 includes a first pad 1220 (e.g., first bump pad) and a second pad 1230 (e.g., second bump pad). The first terminal 956 of the third inductor 955 of the switching circuit 912 is coupled to the first pad 1220 (e.g., by one or more metal lines on the chip 1210). The first pad 1220 is coupled to the first antenna 410 via a first transmission line 1222 (e.g., metal line, cable, or another type of transmission line). Thus, in this example, the first terminal 956 of the third inductor 955 of the switching circuit 912 is coupled to the first antenna 410 via the first pad 1220.

The first terminal 962 of the fourth inductor 960 of the switching circuit 912 is coupled to the second pad 1230 (e.g., by one or more metal lines on the chip 1210). The second pad 1230 is coupled to the second antenna 415 via a second transmission line 1232 (e.g., metal line, cable, or another type of transmission line). Thus, in this example, the first terminal 962 of the fourth inductor 960 of the switching circuit 912 is coupled to the second antenna 415 via the second pad 1230.

The power amplifier 420 and the LNA 470 may also be integrated on the chip 1210, an example of which is shown in FIG. 12. However, it is to be appreciated that the present disclosure is not limited to this example. For example, the power amplifier 420 and/or the LNA 470 may be integrated on another chip in some implementations.

Figure 13:
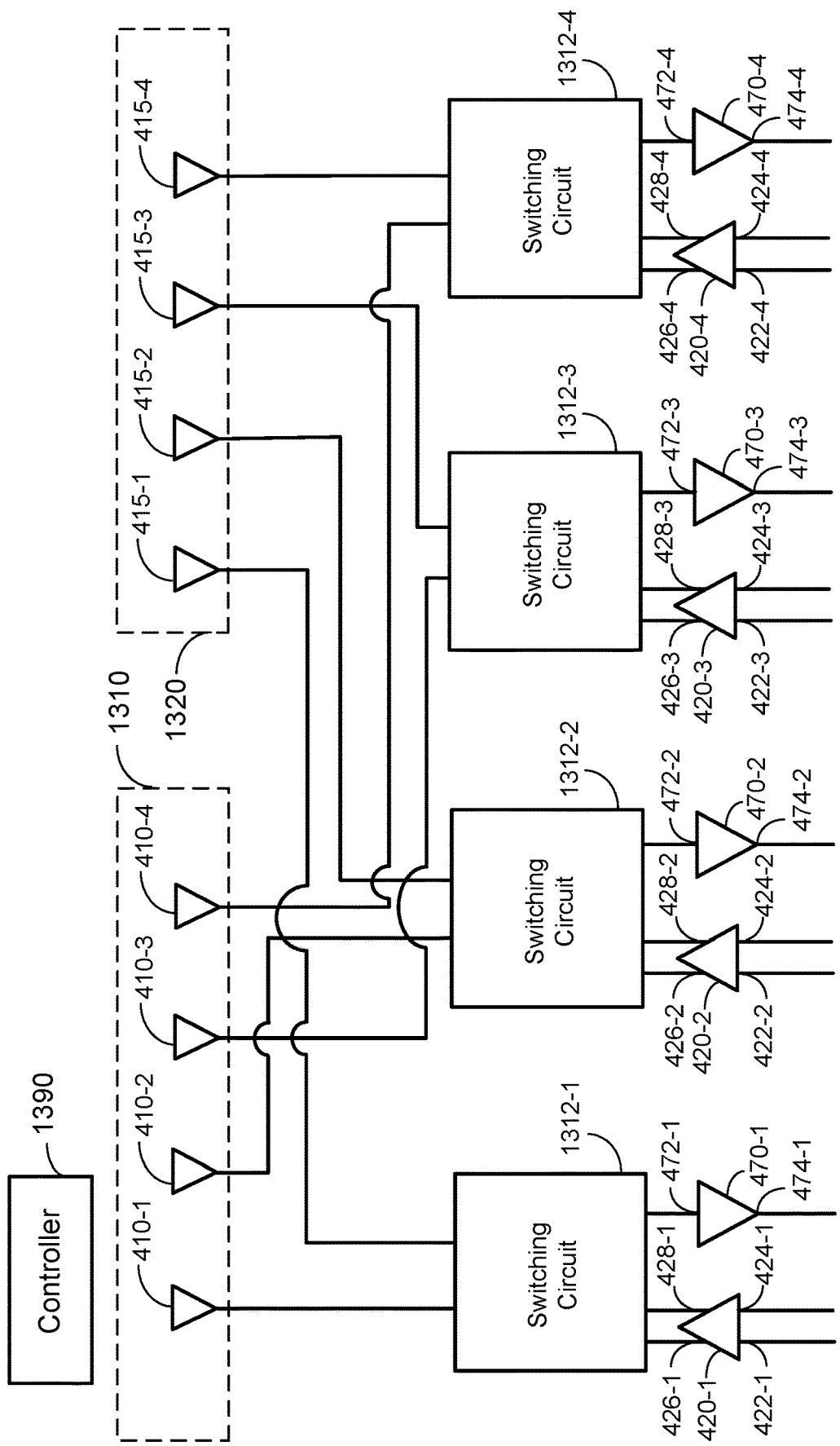
FIG. 13 shows an example of switching circuits configured to selectively couple antennas in two antenna arrays to amplifiers according to certain aspects of the present disclosure.

Multiple instances of the switching circuit 412 or 912 may be used to switch between a first antenna array and a second antenna array in a wireless device. In this regard, FIG. 13 shows an example of a wireless device including a first antenna array 1310, a second antenna array 1320, multiple switching circuits 1312-1 to 1312-4, multiple power amplifiers 420-1 to 420-4, and multiple LNAs 470-1 to 470-4. The first antenna array 1310 includes antennas 410-1 to 410-4 and the second antenna array 1320 includes antennas 415-1 to 415-4 according to certain aspects. The first antenna array 1310 and the second antenna array 1320 be on the same antenna module (e.g., antenna module 110, 140, or 170) or separate antenna modules. For the example of antenna module 110, the antennas 410-1 to 410-4 in the first antenna array 1310 may correspond to the patch antennas 115-1 to 115-4 and the antennas 415-1 to 415-4 in the second antenna array 1320 may correspond to the dipole antennas 120-1 to 120-4. For the example of the L-shaped antenna module 140, the antennas 410-1 to 410-4 in the first antenna array 1310 may correspond to the antennas 150-1 to 150-4 and the antennas 415-1 to 415-4 in the second antenna array 1320 may correspond to the antennas 160-1 to 160-4. For the example of the T-shaped antenna module 170, the antennas 410-1 to 410-4 in the first antenna array 1310 may correspond to the antennas 180-1 to 180-4 and the antennas 415-1 to 415-4 in the second antenna array 1320 may correspond to the antennas 190-1 to 190-4. Although each antenna array 1310 and 1320 includes four antennas in the example shown in FIG. 13, it is to be appreciated that each antenna array 1310 and 1320 may include a different number of antennas.

Each of the switching circuits 1312-1 to 1312-4 is coupled to a respective one of the antennas 410-1 to 410-4 in the first antenna array 1310 and a respective one of the antennas 415-1 to 415-4 in the second antenna array 1320. Also, each of the switching circuits 1312-1 to 1312-4 is coupled to the output of a respective one of the power amplifiers 420-1 to 420-4 and the input 472-1 to 472-4 of a respective one of the LNAs 470-1 to 470-4. In the example in FIG. 13, each of the power amplifier 420-1 to 420-4 has a differential output including a first output 426-1 to 426-4 and a second output 428-1 to 428-4.

Each of the switching circuits 1312-1 to 1312-4 may be implemented with the exemplary switching circuit 412 according to any of the exemplary implementations shown in FIGS. 4 to 8 (i.e., each of switching circuits 1312-1 to 1312-4 may be a separate instance of the exemplary switching circuit 412). Thus, in this example, the description of the switching circuit 412 given above applies to each of the switching circuits 1312-1 to 1312-4.

In another example, each of the switching circuits 1312-1 to 1312-4 may be implemented with the exemplary switching circuit 912 according to any of the exemplary implementations shown in FIGS. 9 to 12 (i.e., each of switching circuits 1312-1 to 1312-4 may be a separate instance of the exemplary switching circuit 912). Thus, in this example, the description of the switching circuit 912 given above applies to each of the switching circuits 1312-1 to 1312-4.

In operation, each of the switching circuits 1312-1 to 1312-4 is configured to couple the respective power amplifier 420-1 to 420-4 and LNA 470-1 to 470-4 to the respective antenna 410-1 to 410-4 in the first antenna array 1310 or the respective antenna 415-1 to 415-4 in the second antenna array 1320 depending on which one of the antenna arrays 1310 and 1320 is active at a given time. For example, when the first antenna array 1310 is active (e.g., first antenna mode), the controller 1390 controls the switches in the switching circuits 1312-1 to 1312-4 such that each of the switching circuits 1312-1 to 1312-4 couples the respective power amplifier 420-1 to 420-4 to the respective antenna 410-1 to 410-4 in the first antenna array 1310 in the transmit mode and couples the respective LNA 470-1 to 470-4 to the respective antenna 410-1 to 410-4 in the first antenna array 1310 in the receive mode. When the second antenna array 1320 is active (e.g., second antenna mode), the controller 1390 controls the switches in the switching circuits 1312-1 to 1312-4 such that each of the switching circuits 1312-1 to 1312-4 couples the respective power amplifier 420-1 to 420-4 to the respective antenna 415-1 to 415-4 in the second antenna array 1320 in the transmit mode and couples the respective LNA 470-1 to 470-4 to the respective antenna 415-1 to 415-4 in the second antenna array 1320 in the receive mode. In this manner, the switching circuits 1312-1 to 1312-4 allow the antennas 410-1 to 410-4 in the first antenna array 1310 and the antennas 415-1 to 415-4 in the second antenna array 1320 to share the power amplifiers 420-1 to 420-4 and the LNAs 470-1 to 4170-4, thereby reducing the cost and area. Note that the individual connections between the controller 1390 and the switching circuits 1312-1 to 1312-4 are explicitly shown in FIG. 13.

Figure 14:
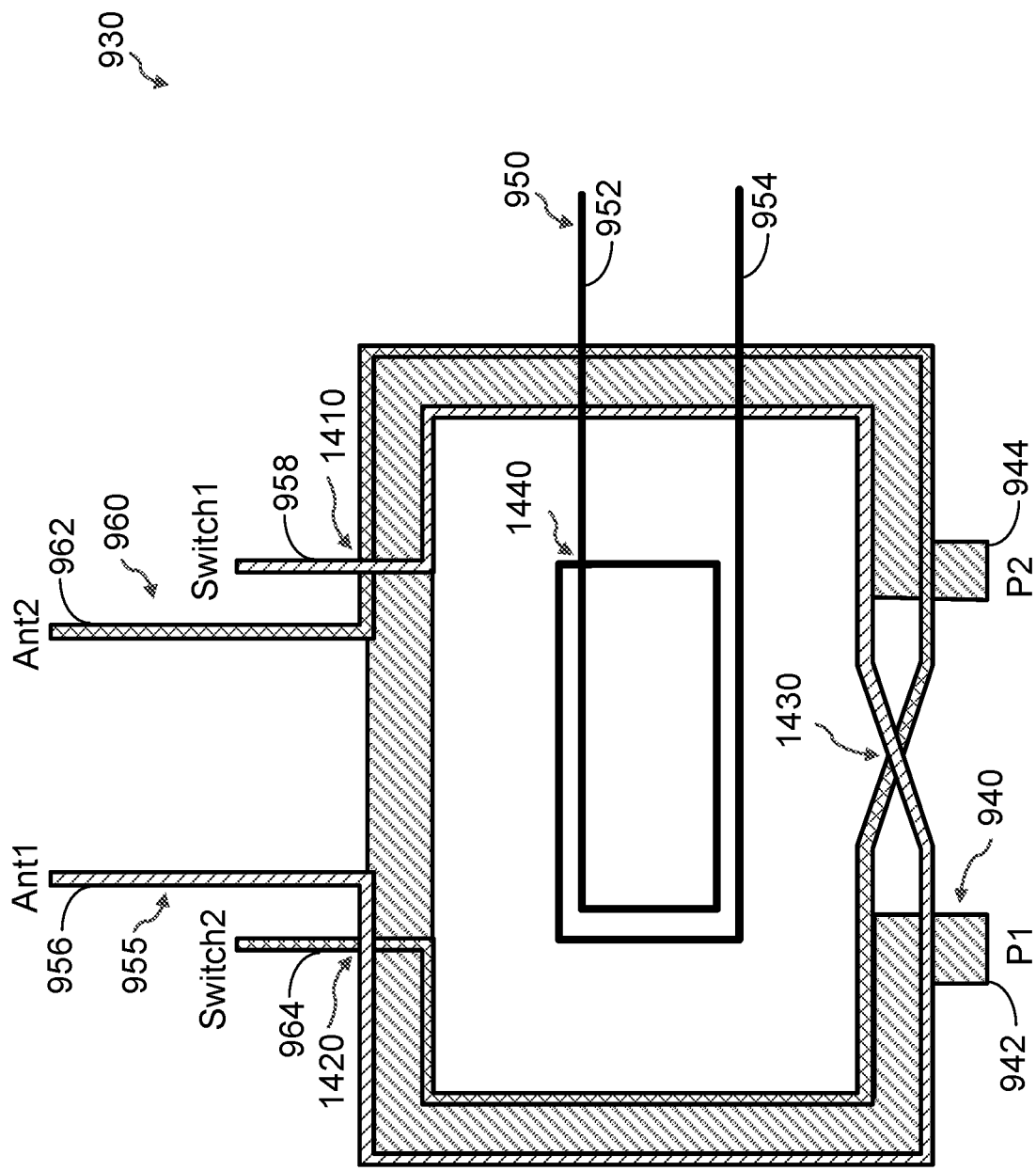
FIG. 14 shows an exemplary layout for a quad-coil transformer according to certain aspects of the present disclosure.

FIG. 14 shows a top view of an exemplary layout for the quad-coil transformer 930 according to certain aspects of the present disclosure. In this example, each of the first inductor 940, the third inductor 955, and the fourth inductor 960 is implemented with a respective loop inductor, and the second inductor 950 is implemented with a spiral inductor. However, it is to be appreciated that the inductors 940, 950, 955, and 960 are not limited to the exemplary implementations shown in FIG. 14 and may be implemented with other types of inductors. In this example, the transformer 930 may be integrated on a chip (e.g., the chip 1210).

The first inductor 940 may be formed from a first metal layer on the chip, and the third inductor 955 and the fourth inductor 960 may be formed from a second metal layer on the chip (e.g., using photolithography). In this example, the first metal layer may be located below or above the second metal layer with respect to the substrate of the chip. The first metal layer and the second metal layer may be separated by an electrically insulating material (not shown).

In the example in FIG. 14, the third inductor 955 is approximately aligned with the first inductor 940 for magnetically coupling the third inductor 955 and the first inductor 940. The magnetic coupling allows the transformer 930 to transfer power from the output of the power amplifier 420 to the first antenna 410 when the first antenna 410 is being used for RF transmission. In the example in FIG. 14, the third inductor 955 is located above the first inductor 940 with respect to the substrate. However, it is to be appreciated that, in other implementations, the third inductor 955 may be located below the first inductor 940.

In the example in FIG. 14, the fourth inductor 960 is approximately aligned with the first inductor 940 for magnetically coupling the fourth inductor 960 and the first inductor 940. The magnetic coupling allows the transformer 930 to transfer power from the output of the power amplifier 420 to the second antenna 415 when the second antenna 415 is being used for RF transmission. In the example in FIG. 14, the fourth inductor 960 is located above the first inductor 940 with respect to the substrate. However, it is to be appreciated that, in other implementations, the fourth inductor 960 may be located below the first inductor 940.

In the example shown in FIG. 14, the third inductor 955 crosses the fourth inductor 960 at crossing points 1410, 1420, and 1430. For the example in which the third inductor 955 and the fourth inductor 960 are formed from the same metal layer (e.g., the second metal layer), the third inductor 955 and the fourth inductor 960 may be electrically isolated from each other at each of the crossing points 1410, 1420, and 1430 using an overpass structure or an underpass structure.

In this regard, FIG. 15A shows a side view of an exemplary overpass structure 1510 that may be used at each of the crossing points 1410, 1420, and 1430 according certain aspects. In the example shown in FIG. 15A, the overpass structure 1510 passes over the fourth inductor 960. In this example, there is a gap 1540 (i.e., break) in the third inductor 955 through which the fourth inductor 960 passes. The overpass structure 1510 is configured to provide an electrical interconnect for the third inductor 955 over the gap 1540. In this example, the overpass structure 1510 includes a first via 1520, a second via 1525, and a bridge 1530. The first via 1520 is coupled to the third inductor 955 on one side of the gap 1540 and the second via 1525 is coupled to the third inductor 955 on the other side of the gap 1540. The bridge 1530 extends over the gap 1540 with one end of the bridge 1530 coupled to the first via 1520 and the other end of the bridge 1530 coupled to the second via 1525. The bridge 1530 may be formed from a third metal layer on the chip that is located above the second metal layer with respect to the substrate.

FIG. 15B shows another example in which the overpass structure 1510 passes over the third inductor 955. In this example, there is a gap 1550 (i.e., break) in the fourth inductor 960 through which the third inductor 955 passes. The overpass structure 1510 is configured to provide an electrical interconnect for the fourth inductor 960 over the gap 1550. In this example, the first via 1520 is coupled to the fourth inductor 960 on one side of the gap 1550 and the second via 1525 is coupled to the fourth inductor 960 on the other side of the gap 1550. The bridge 1530 extends over the gap 1550 with one end of the bridge 1530 coupled to the first via 1520 and the other end of the bridge 1530 coupled to the second via 1525.

FIG. 16A shows a side view of an exemplary underpass structure 1610 that may be used at each of the crossing points 1410, 1420, and 1430 according certain aspects. In the example shown in FIG. 16A, the underpass structure 1610 passes under the fourth inductor 960. In this example, there is a gap 1640 (i.e., break) in the third inductor 955 through which the fourth inductor 960 passes. The underpass structure 1610 is configured to provide an electrical interconnect for the third inductor 955 under the gap 1640. In this example, the underpass structure 1610 includes a first via 1620, a second via 1625, and a bridge 1630. The first via 1620 is coupled to the third inductor 955 on one side of the gap 1640 and the second via 1625 is coupled to the third inductor 955 on the other side of the gap 1640. The bridge 1630 extends under the gap 1640 with one end of the bridge 1630 coupled to the first via 1620 and the other end of the bridge 1630 coupled to the second via 1625. The bridge 1630 may be formed from a third metal layer on the chip that is located below the second metal layer with respect to the substrate.

FIG. 16B shows another example in which the underpass structure 1610 passes under the third inductor 955. In this example, there is a gap 1650 (i.e., break) in the fourth inductor 960 through which the third inductor 955 passes. The underpass structure 1610 is configured to provide an electrical interconnect for the fourth inductor 960 under the gap 1650. In this example, the first via 1620 is coupled to the fourth inductor 960 on one side of the gap 1650 and the second via 1625 is coupled to the fourth inductor 960 on the other side of the gap 1650. The bridge 1630 extends under the gap 1650 with one end of the bridge 1630 coupled to the first via 1620 and the other end of the bridge 1630 coupled to the second via 1625.

In the example shown in FIG. 14, the second inductor 950 is located within the inner loop of the third inductor 955, which magnetically couples the second inductor 950 with the third inductor 955. The magnetic coupling allows the transformer 930 to transfer power from the first antenna 410 to the LNA 470 when the first antenna 410 is being used for RF reception. Also, the second inductor 950 is located within the inner loop of the fourth inductor 960, which magnetically couples the second inductor 950 with the fourth inductor 960. The magnetic coupling allows the transformer 930 to transfer power from the second antenna 415 to the LNA 470 when the first antenna 410 is being used for RF reception.

In the example shown in FIG. 14, the second inductor 950 crosses itself at crossing point 1440. In this example, the second inductor 950 may cross itself using an overpass structure (e.g., overpass structure 1510) or an underpass structure (e.g., under pass structure 1610). The second inductor 950 may also cross the third inductor 955 and the fourth inductor 960, as shown in the example in FIG. 14. For the example in which the second inductor 950 is formed from the same metal layer (e.g., second metal layer) as the third inductor 955 and the fourth inductor 960, the second inductor 950 may cross the third inductor 955 and the fourth inductor 960 using one or more overpass structures and/or one or more underpass structures.

Figure 17:
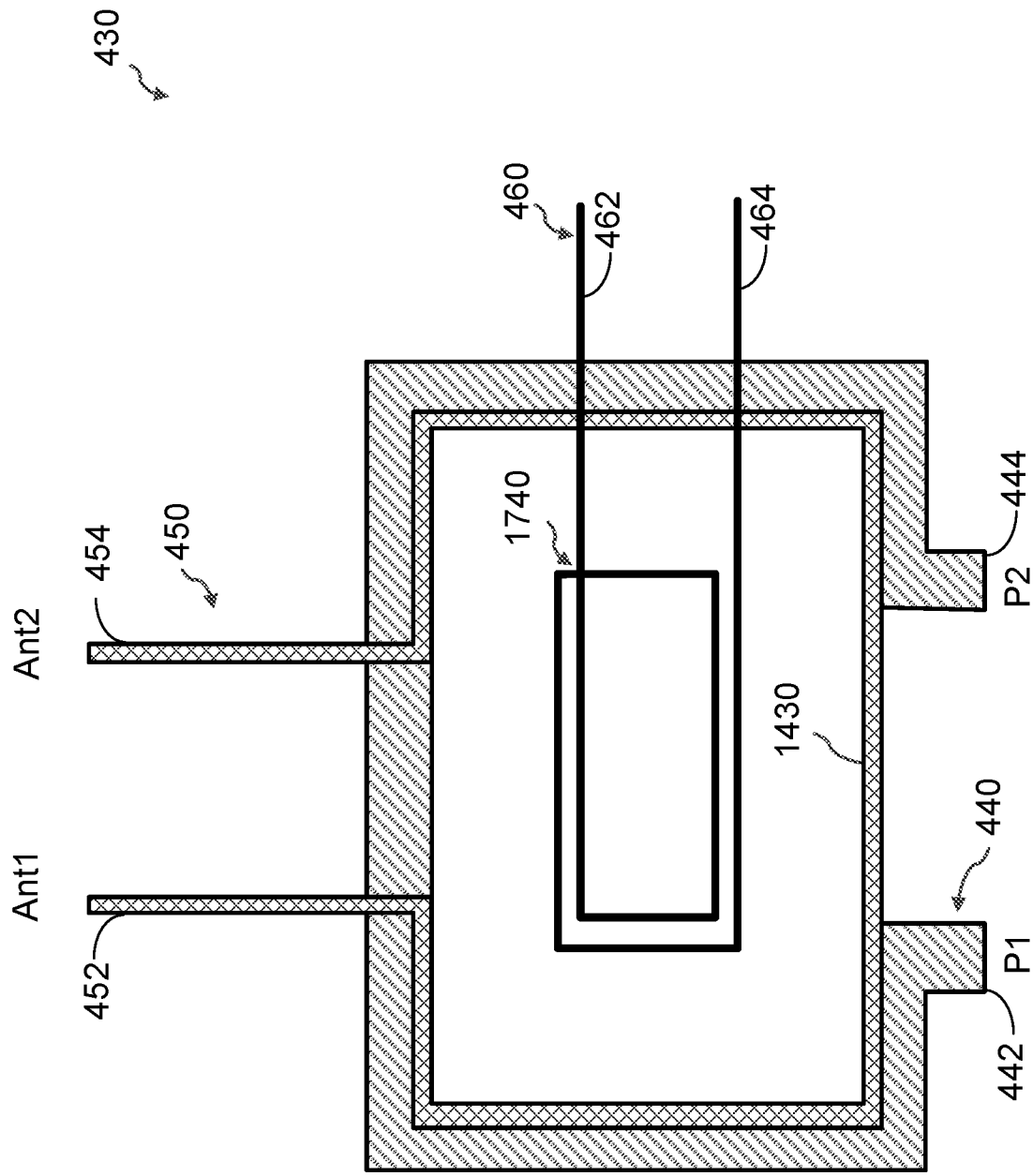
FIG. 17 shows an exemplary layout for a tri-coil transformer according to certain aspects of the present disclosure.

FIG. 17 shows a top view of an exemplary layout for the tri-coil transformer 430 according to certain aspects of the present disclosure. In this example, each of the first inductor 440 and the second inductor 450 is implemented with a respective loop inductor, and the third inductor 460 is implemented with a spiral inductor. However, it is to be appreciated that the inductors 440, 450, and 460 are not limited to the exemplary implementations shown in FIG. 17 and may be implemented with other types of inductors. In this example, the transformer 430 may be integrated on a chip (e.g., the chip 610).

The first inductor 440 may be formed from a first metal layer on the chip, and the second inductor 450 and the third inductor 460 may be formed from a second metal layer on the chip (e.g., using photolithography). In this example, the first metal layer may be located below or above the second metal layer with respect to the substrate of the chip. The first metal layer and the second metal layer may be separated by an electrically insulating material (not shown).

In the example in FIG. 17, the second inductor 450 is approximately aligned with the first inductor 440 for magnetically coupling the second inductor 450 and the first inductor 440. The magnetic coupling allows the transformer 430 to transfer power from the output of the power amplifier 420 to the first antenna 410 in the first antenna mode or to the second antenna 415 in the second antenna mode. In the example in FIG. 17, the second inductor 450 is located above the first inductor 440 with respect to the substrate. However, it is to be appreciated that, in other implementations, the second inductor 450 may be located below the first inductor 440.

In the example shown in FIG. 17, the third inductor 460 is located within the inner loop of the second inductor 450, which magnetically couples the third inductor 460 with the second inductor 450. The magnetic coupling allows the transformer 430 to transfer power from the first antenna 410 to the LNA 470 in the first antenna mode or from the second antenna 415 to the LNA 470 in the second antenna mode.

In the example shown in FIG. 14, the third inductor 460 crosses itself at crossing point 1740. In this example, the third inductor 460 may cross itself using an overpass structure (e.g., overpass structure 1510) or an underpass structure (e.g., under pass structure 1610). The third inductor 460 may also cross the second inductor 450, as shown in the example in FIG. 17. For the example in which the third inductor 460 is formed from the same metal layer (e.g., second metal layer) as the second inductor 450, the third inductor 460 may cross the second inductor 450 using one or more overpass structures and/or one or more underpass structures.

Figure 18:
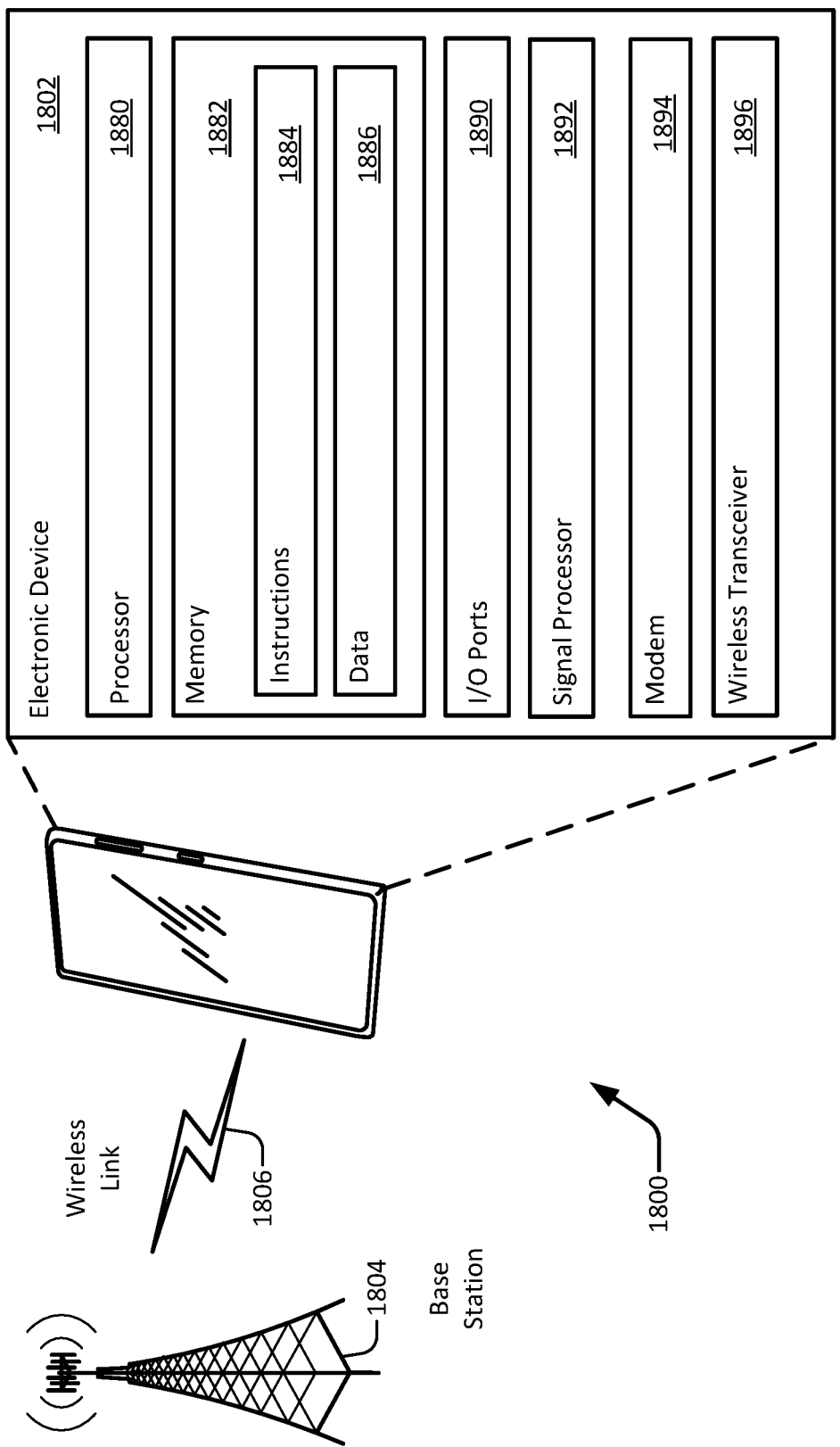
FIG. 18 is a diagram of an environment including an electronic device that includes a transceiver according to certain aspects of the present disclosure.

FIG. 18 is a diagram of an environment 1800 that includes an electronic device 1802 that includes a wireless transceiver 1896. The transceiver 1896 may include the power amplifier 420, the multiple power amplifiers 420-1 to 420-4, the LNA 470, the multiple LNAs 470-1 to 470-4, the switching circuit 412, the switching circuit 912, and/or the switching circuits 1312-1 to 1312-4 discussed above. In the environment 1800, the electronic device 1802 communicates with a base station 1804 through a wireless link 1806. As shown, the electronic device 1802 is depicted as a smart phone. However, the electronic device 1802 may be implemented as any suitable computing or other electronic device, such as a cellular base station, broadband router, access point, cellular or mobile phone, gaming device, navigation device, media device, laptop computer, desktop computer, tablet computer, server computer, network-attached storage (NAS) device, smart appliance, vehicle-based communication system, Internet of Things (IoT) device, sensor or security device, asset tracker, and so forth.

The base station 1804 communicates with the electronic device 1802 via the wireless link 1806, which may be implemented as any suitable type of wireless link. Although depicted as a base station tower of a cellular radio network, the base station 1804 may represent or be implemented as another device, such as a satellite, terrestrial broadcast tower, access point, peer to peer device, mesh network node, fiber optic line, another electronic device generally as described above, and so forth. Hence, the electronic device 1802 may communicate with the base station 1804 or another device via a wired connection, a wireless connection, or a combination thereof. The wireless link 1806 can include a downlink of data or control information communicated from the base station 1804 to the electronic device 1802 and an uplink of other data or control information communicated from the electronic device 1802 to the base station 1804. The wireless link 1806 may be implemented using any suitable communication protocol or standard, such as 3rd Generation Partnership Project Long-Term Evolution (3GPP LTE, 3GPP NR 5G), IEEE 802.11, IEEE 802.16, Bluetooth™, and so forth.

The electronic device 1802 includes a processor 1880 and a memory 1882. The memory 1882 may be or form a portion of a computer readable storage medium. The processor 1880 may include any type of processor, such as an application processor or a multi-core processor, that is configured to execute processor-executable instructions (e.g., code) stored by the memory 1882. The memory 1882 may include any suitable type of data storage media, such as volatile memory (e.g., random access memory (RAM)), non-volatile memory (e.g., Flash memory), optical media, magnetic media (e.g., disk or tape), and so forth. In the context of this disclosure, the memory 1882 is implemented to store instructions 1884, data 1886, and other information of the electronic device 1802, and thus when configured as or part of a computer readable storage medium, the memory 1882 does not include transitory propagating signals or carrier waves.

The electronic device 1802 may also include input/output ports 1890. The I/O ports 1890 enable data exchanges or interaction with other devices, networks, or users or between components of the device.

The electronic device 1802 may further include a signal processor (SP) 1892 (e.g., such as a digital signal processor (DSP)). The signal processor 1892 may function similar to the processor and may be capable executing instructions and/or processing information in conjunction with the memory 1882.

For communication purposes, the electronic device 1802 also includes a modem 1894, a wireless transceiver 1896, and one or more antennas (e.g., the first antenna 410, the second antenna 415, the first antenna array 1310, and/or the second antenna array 1320). The wireless transceiver 1896 provides connectivity to respective networks and other electronic devices connected therewith using RF wireless signals. The wireless transceiver 1896 may facilitate communication over any suitable type of wireless network, such as a wireless local area network (LAN) (WLAN), a peer to peer (P2P) network, a mesh network, a cellular network, a wireless wide area network (WWAN), a navigational network (e.g., the Global Positioning System (GPS) of North America or another Global Navigation Satellite System (GNSS)), and/or a wireless personal area network (WPAN).

The controller 490, the controller 990, and the controller 1390 may each be implemented with a general-purpose processor, a digital signal processor (DSP), an application specific integrated circuit (ASIC), a field programmable gate array (FPGA) or other programmable logic device, discrete hardware components (e.g., logic gates), or any combination thereof designed to perform the functions described herein. A processor may perform the functions described herein by executing software comprising code for performing the functions. The software may be stored on a computer-readable storage medium, such as a RAM, a ROM, an EEPROM, an optical disk, and/or a magnetic disk.

Figure 19:
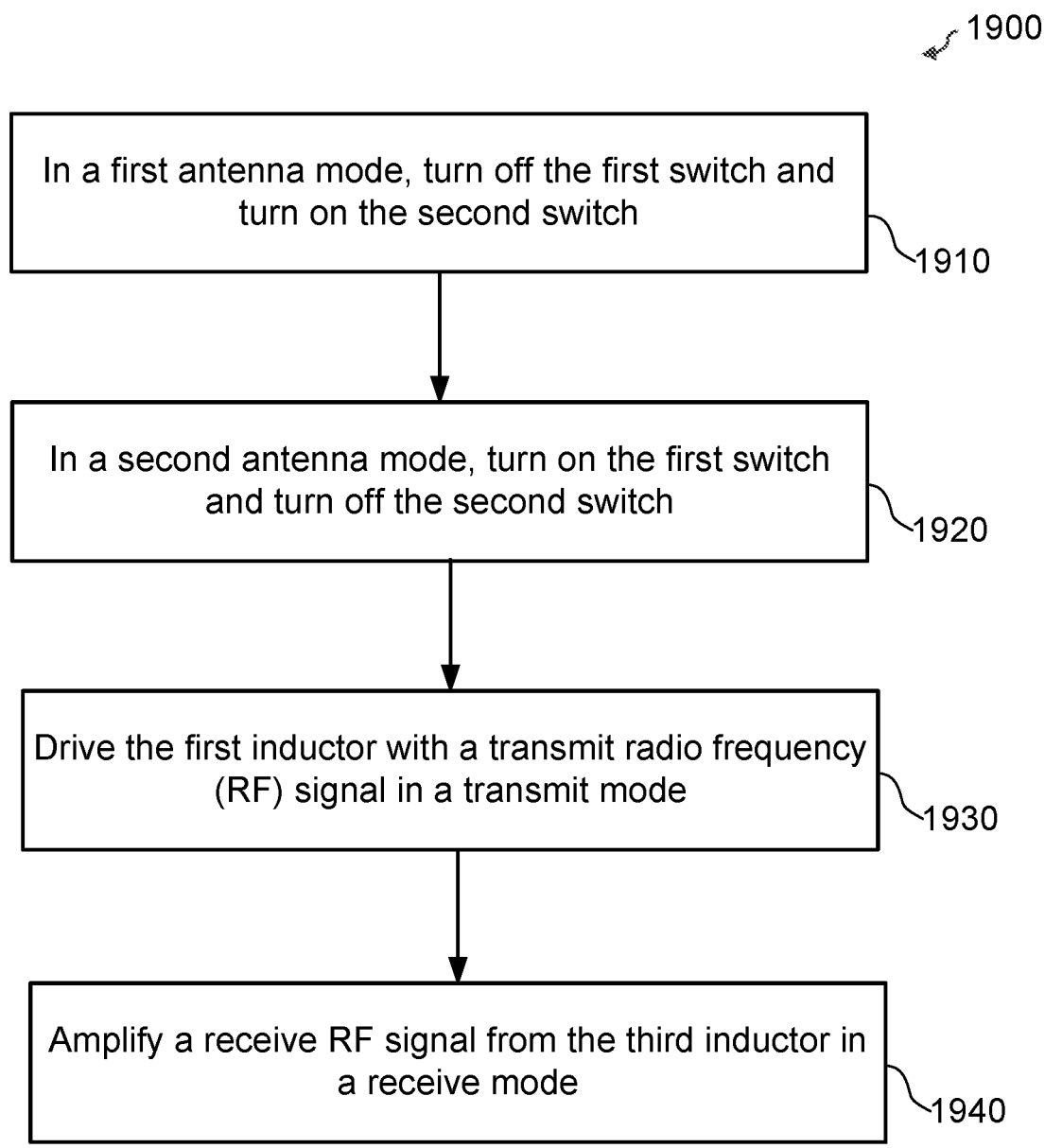
FIG. 19 illustrates an example of a method of operation of an apparatus according to certain aspects of the present disclosure.

FIG. 19 is a flowchart illustrating a method 1900 of operation of an apparatus according to certain aspects. The apparatus may be included in an electronic device (e.g., device 1802). The apparatus includes a transformer (e.g., transformer 430) including a first inductor (e.g., first inductor 440), a second inductor (e.g., second inductor 450), and a third inductor (e.g., third inductor 460). The apparatus also includes a first antenna (e.g., first antenna 410) coupled to a first terminal of the second inductor, a second antenna (e.g., second antenna 415) coupled to a second terminal of the second inductor, a first switch (e.g., first switch 475) coupled between the first terminal of the second inductor and a ground, and a second switch (e.g., second switch 480) coupled between the second terminal of the second inductor and the ground.

At block 1910, in a first antenna mode, the first switch is turned off and the second switch is turned on. For example, the first switch may be turned off and the second switch may be turned on by the controller 490.

At block 1920, in a second antenna mode, the first switch is turned on and the second switch is turned off. For example, the first switch may be turned on and the second switch may be turned off by the controller 490.

At block 1930, the first inductor is driven with a transmit radio frequency (RF) signal in a transmit mode. For example, the first inductor may be driven with the transmit RF signal by the power amplifier 420. In this example, the transformer may transfer the power of the RF signal to the first antenna in the first antenna mode or to the second antenna in the second antenna mode.

At block 1940, a receive RF signal from the third inductor is amplified in a receive mode. For example, the receive RF signal may be amplified by the low-noise amplifier 470. In this example, the transformer may transfer the power of the RF signal received by the first antenna in the first antenna mode to the third inductor or transfer the power of the RF signal received by the second antenna in the second antenna mode to the third inductor.

It is to be appreciated that the exemplary blocks 1910, 1920, 1930, and 1940 illustrated in FIG. 19 may be performed in any order, and that multiple blocks may be performed concurrently.

In certain aspects, the apparatus further includes a low-noise amplifier (e.g., low-noise amplifier 470) coupled to the third inductor and a third switch (e.g., switch 510) coupled between an input of the low-noise inductor and the ground. In this example, the method 1900 may also include turning off the third switch in the receive mode and turning on the third switch in the transmit mode. The third switch may be turned on and off by the controller 490.

In certain aspects, the apparatus further includes a third switch (e.g., switch 520) coupled between a first terminal (e.g., terminal 452) of the third inductor and the ground, wherein a second terminal (e.g., second terminal 454) of the third inductor is coupled to an input (e.g., input 472) of a low-noise amplifier (e.g., low-noise amplifier 470). In this example, the method 1900 may also include turning on the third switch in the receive mode and turning off the third switch in the transmit mode. The third switch may be turned on and off by the controller 490.

Figure 20:
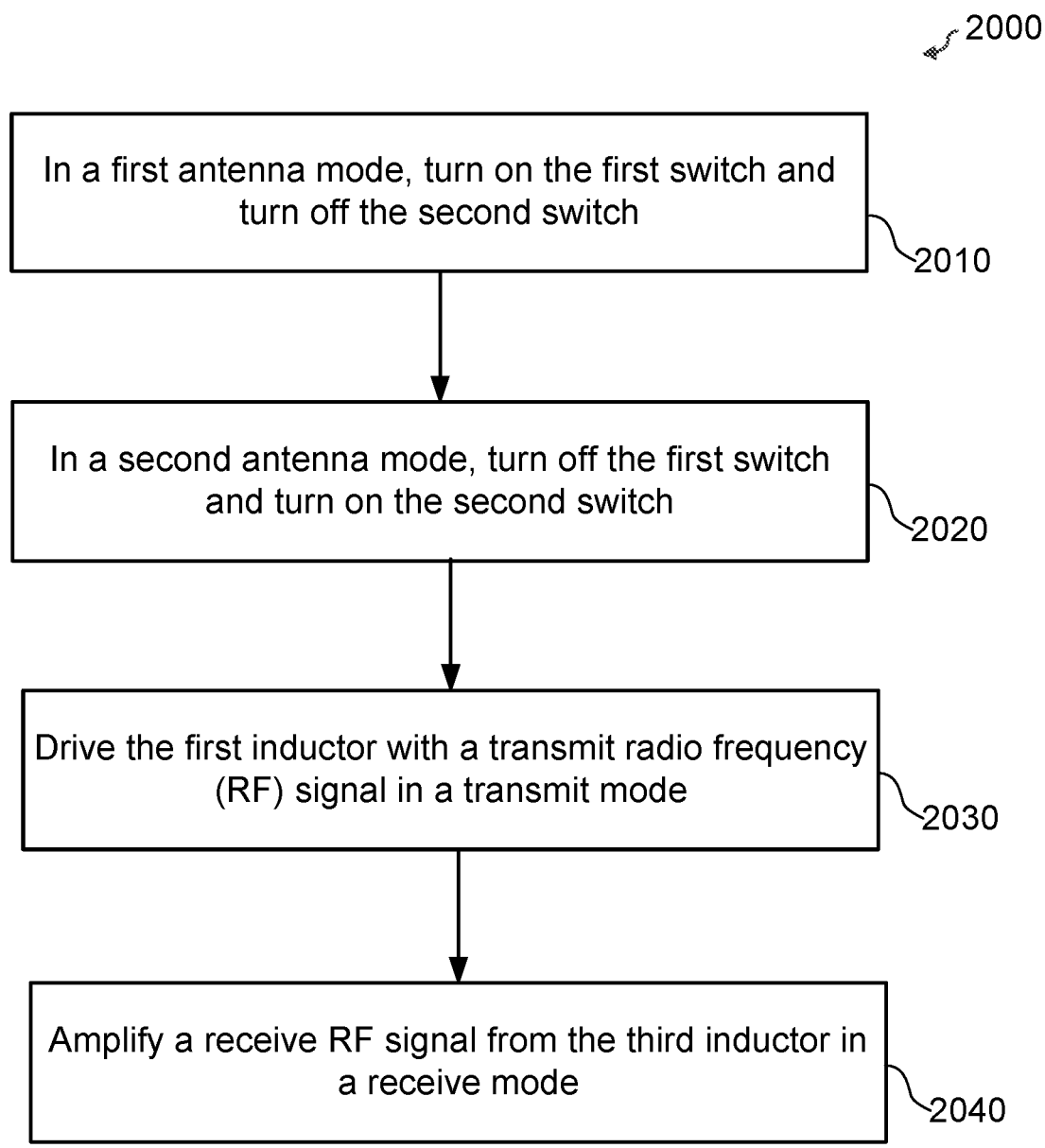
FIG. 20 illustrates another example of a method of operation of an apparatus according to certain aspects of the present disclosure.

FIG. 20 is a flowchart illustrating a method 2000 of operation of an apparatus according to certain aspects. The apparatus may be included in an electronic device (e.g., device 1802). The apparatus includes a transformer (e.g., transformer 930) including a first inductor (e.g., first inductor 940), a second inductor (e.g., second inductor 950), a third inductor (e.g., third inductor 955), and a fourth inductor (e.g., fourth inductor 960), a first antenna (e.g., first antenna 410) coupled to a first terminal of the third inductor, a first switch (e.g., first switch 970) coupled between a second terminal of the third inductor and a ground, a second antenna (e.g., second antenna 415) coupled to a first terminal of the fourth inductor, and a second switch (e.g., second switch 975) coupled between a second terminal of the fourth inductor and the ground.

At block 2010, in a first antenna mode, the first switch is turned on and the second switch is turned off. For example, the first switch may be turned on and the second switch may be turned off by the controller 990.

At block 2020, in a second antenna mode, the first switch is turned off and the second switch is turned on. For example, the first switch may be turned off and the second switch may be turned on by the controller 990.

At block 2030, the first inductor is driven with a transmit radio frequency (RF) signal in a transmit mode. For example, the first inductor may be driven with the transmit RF signal by the power amplifier 420. In this example, the transformer may transfer the power of the RF signal to the first antenna in the first antenna mode or to the second antenna in the second antenna mode.

At block 2040, a receive RF signal from the second inductor is amplified in a receive mode. For example, the receive RF signal may be amplified by the low-noise amplifier 470. In this example, the transformer may transfer the power of the RF signal received by the first antenna in the first antenna mode to the second inductor or transfer the power of the RF signal received by the second antenna in the second antenna mode to the second inductor.

It is to be appreciated that the exemplary blocks 2010, 2020, 2030, and 2040 illustrated in FIG. 20 may be performed in any order, and that multiple blocks may be performed concurrently.

In certain aspects, the apparatus includes a third switch (e.g., switch 1010) coupled between the first terminal of the third inductor and the ground, and a fourth switch (e.g., switch 1020) coupled between the first terminal of the fourth inductor and the ground. In this example, the method 2000 may further include turning off the third switch and turning on the fourth switch in the first antenna mode, and turning on the third switch and turning off the fourth switch in the second antenna mode. The third switch and the fourth switch may be turned on and off by the controller 990.

In certain aspects, the apparatus includes a low-noise amplifier coupled to a first terminal of the second inductor and a third switch (e.g., switch 1120) coupled between a second terminal of the second inductor and a ground. In this example, the method 2000 may further include turning on the third switch in the receive mode, and turning off the third switch in the transmit mode. The third switch may be turned on and off the by the controller 990.

In certain aspects, the apparatus includes a low-noise amplifier coupled to the second inductor and a third switch (e.g., switch 1110) coupled between the input of the low-noise amplifier and the ground. In this example, the method 2000 may further include turning off the third switch in the receive mode, and turning on the third switch in the transmit mode. The third switch may be turned on and off the by the controller 990.

Implementation examples are described in the following numbered clauses:

1. An apparatus, comprising:
   a transformer including a first inductor, a second inductor, and a third inductor;
   a power amplifier coupled to the first inductor;
   a first antenna coupled to a first terminal of the second inductor;
   a second antenna coupled to a second terminal of the second inductor;
   a first switch coupled between the first terminal of the second inductor and a ground;
   a second switch coupled between the second terminal of the second inductor and the ground; and
   a low-noise amplifier coupled to the third inductor.

2. The apparatus of clause 1, wherein the first antenna comprises a patch antenna, and the second antenna comprises a dipole antenna.

3. The apparatus of clause 1, wherein the first antenna is on a first surface, the second antenna is on a second surface, and the first surface and the second surface face different directions.

4. The apparatus of clause 3, wherein the first surface and the second surface are orientated approximately perpendicular to each other.

5. The apparatus of any one of clauses 1 to 4, wherein the power amplifier is a differential power amplifier having a first output and a second output, the first output is coupled to a first terminal of the first inductor, and the second output is coupled to a second terminal of the first inductor.

6. The apparatus of any one of clauses 1 to 5, further comprising a shunt inductor coupled between the second inductor and a ground.

7. The apparatus of clause 6, wherein the shunt inductor is coupled to a center tap of the second inductor.

8. The apparatus of any one of clauses 1 to 5, further comprising:
a first shunt inductor coupled in parallel with the first switch; and
a second shunt inductor coupled in parallel with the second switch.

9. The apparatus of any one of clauses 1 to 8, further comprising a controller configured to:
turn off the first switch and turn on the second switch in a first antenna mode; and
turn on the first switch and turn off the second switch in a second antenna mode.

10. The apparatus of any one of clauses 1 to 9, further comprising a third switch coupled between an input of the low-noise amplifier and the ground.

11. The apparatus of any one of clauses 1 to 9, further comprising a third switch coupled between a first terminal of the third inductor and the ground, wherein an input of the low-noise amplifier is coupled to a second terminal of the third inductor.

12. The apparatus of clause 11, further comprising a fourth switch coupled between the input of the low-noise amplifier and the ground.

13. The apparatus of clause 12, further comprising a controller configured to:
turn off the third switch and turn on the fourth switch in a transmit mode; and
turn on the third switch and turn off the fourth switch in a receive mode.

14. A wireless device, comprising:
a first antenna array comprising a first plurality of antennas;
a second antenna array comprising a second plurality of antennas;
a plurality of power amplifiers;
a plurality of low-noise amplifiers; and
a plurality of switching circuits, wherein each of the plurality of switching circuits comprises:
a transformer including a first inductor, a second inductor, and a third inductor, wherein the first inductor is coupled to a respective one of the plurality of power amplifiers, a first terminal of the second inductor is coupled to a respective one of the first plurality of antennas, a second terminal of the second inductor is coupled to a respective one of the second plurality of antennas, and the third inductor is coupled to a respective one of the plurality of low-noise amplifiers;
a first switch coupled between the first terminal of the second inductor and a ground; and
a second switch coupled between the second terminal of the second inductor and the ground.

15. The wireless device of clause 14, wherein each of the first plurality of antennas comprises a patch antenna, and each of the second plurality antennas comprises a dipole antenna.

16. The wireless device of clause 14, wherein the first plurality of antennas are on a first surface, the second plurality of antennas are on a second surface, and the first surface and the second surface face different directions.

17. An apparatus, comprising:
a transformer including a first inductor, a second inductor, a third inductor, and a fourth inductor;
a power amplifier coupled to the first inductor;
a low-noise amplifier coupled to the second inductor;
a first antenna coupled to a first terminal of the third inductor;
a first switch coupled between a second terminal of the third inductor and a ground;
a second antenna coupled to a first terminal of the fourth inductor; and
a second switch coupled between a second terminal of the fourth inductor and the ground.

18. The apparatus of clause 17, wherein the first antenna comprises a patch antenna, and the second antenna comprises a dipole antenna.

19. The apparatus of clause 17, wherein the first antenna is on a first surface, the second antenna is on a second surface, and the first surface and the second surface face different directions.

20. The apparatus of any one of clauses 17 to 19, further comprising:
a first shunt inductor coupled in parallel with the first switch; and
a second shunt inductor coupled in parallel with the second switch.

21. The apparatus of any one of clauses 17 to 20, further comprising a controller configured to:
turn on the first switch and turn off the second switch in a first antenna mode; and
turn off the first switch and turn on the second switch in a second antenna mode.

22. The apparatus of any one of clauses 17 to 21, further comprising a third switch coupled between an input of the low-noise amplifier and the ground.

23. The apparatus of any one of clauses 17 to 21, further comprising:
a third switch coupled between the first terminal of the third inductor and the ground; and
a fourth switch coupled between the first terminal of the fourth inductor and the ground.

24. The apparatus of clause 23, further comprising a controller configured to:
turn on the first switch, turn off the second switch, turn off the third switch, and turn on the fourth switch in a first antenna mode; and
turn off the first switch, turn on the second switch, turn on the third switch, and turn off the fourth switch in a second antenna mode.

25. The apparatus of any one of clauses 17 to 21, wherein a first terminal of the second inductor is coupled to an input of the low-noise amplifier, and the apparatus further comprising a third switch coupled between a second terminal of the second inductor and a ground.

26. The apparatus of clause 25, further comprising a fourth switch coupled between the input of the low-noise amplifier and the ground.

27. The apparatus of clause 26, further comprising a controller configured to:
turn on the third switch and turn off the fourth switch in a receive mode; and
turn off the third switch and turn on the fourth switch in a transmit mode.

28. A wireless device, comprising:
a first antenna array comprising a first plurality of antennas;
a second antenna array comprising a second plurality of antennas;
a plurality of power amplifiers;
a plurality of low-noise amplifiers; and
a plurality of switching circuits, wherein each of the plurality of switching circuits comprises:
a transformer including a first inductor, a second inductor, a third inductor, and a fourth inductor, wherein the first inductor is coupled to a respective one of the plurality of power amplifiers, the second inductor is coupled to a respective one of the plurality of low-noise amplifiers, a first terminal of the third inductor is coupled to a respective one of the first plurality of antennas, and a first terminal of the fourth inductor is coupled to a respective one of the second plurality of antennas;

a first switch coupled between a second terminal of the third inductor and a ground; and a second switch coupled between a second terminal of the fourth inductor and the ground.

29. The wireless device of clause 28, wherein each of the first plurality of antennas comprises a patch antenna, and each of the second plurality antennas comprises a dipole antenna.

30. The wireless device of clause 28, wherein the first plurality of antennas are on a first surface, the second plurality of antennas are on a second surface, and the first surface and the second surface face different directions.

31. A method of operation of an apparatus, wherein the apparatus includes a transformer including a first inductor, a second inductor, and a third inductor, a first antenna coupled to a first terminal of the second inductor, a second antenna coupled to a second terminal of the second inductor, a first switch coupled between the first terminal of the second inductor and a ground, and a second switch coupled between the second terminal of the second inductor and the ground, the method comprising:

in a first antenna mode, turning off the first switch and turning on the second switch;

in a second antenna mode, turning on the first switch and turning off the second switch;

driving the first inductor with a transmit radio frequency (RF) signal in a transmit mode; and amplifying a receive RF signal from the third inductor in a receive mode.

32. The method of clause 31, wherein the apparatus further includes a low-noise amplifier coupled to the third inductor, and a third switch coupled between an input of a low-noise inductor and the ground, and the method further comprises:

turning off the third switch in the receive mode; and turning on the third switch in the transmit mode.

33. The method of clause 31, wherein the apparatus further includes a third switch coupled between a first terminal of the third inductor and the ground, and a low-noise amplifier coupled to a second terminal of the third inductor, and the method further comprises:

turning on the third switch in the receive mode; and turning off the third switch in the transmit mode.

34. A method of operation of an apparatus, wherein the apparatus includes a transformer including a first inductor, a second inductor, a third inductor, and a fourth inductor, a first antenna coupled to a first terminal of the third inductor, a first switch coupled between a second terminal of the third inductor and a ground, a second antenna coupled to a first terminal of the fourth inductor, and a second switch coupled between a second terminal of the fourth inductor and the ground, the method comprising:

in a first antenna mode, turning on the first switch and turning off the second switch;

in a second antenna mode, turning off the first switch and turning on the second switch;

driving the first inductor with a transmit radio frequency (RF) signal in a transmit mode; and amplifying a receive RF signal from the second inductor in a receive mode.

35. The method of clause 34, wherein the apparatus includes a third switch coupled between the first terminal of the third inductor and the ground, and a fourth switch coupled between the first terminal of the fourth inductor and the ground, and the method comprises:

turning off the third switch and turning on the fourth switch in the first antenna mode; and turning on the third switch and turning off the fourth switch in the second antenna mode.

36. The method of clause 34, wherein the apparatus includes a low-noise amplifier coupled to a first terminal of the second inductor and a third switch coupled between a second terminal of the second inductor and a ground, and the method further comprises:

turning on the third switch in the receive mode; and turning off the third switch in the transmit mode.

37. The method of clause 34, where the apparatus includes a low-noise amplifier coupled to the second inductor, and a third switch coupled between the input of the low-noise amplifier and the ground, and wherein the method further comprises:

turning off the third switch in the receive mode; and turning on the third switch in the transmit mode.

It is to be appreciated that the present disclosure is not limited to the exemplary terminology used above to describe aspects of the present disclosure. For example, an inductor of a transformer may also be referred to as a winding or another term. Also, it is to be appreciated that an inductor may be referred to as a coil even in cases where the inductor is not physically implemented with a coil. It is also to be appreciated that magnetic coupling may also be referred to as inductive coupling or another term. It is also to be appreciated that antennas in an antenna array may also be referred to as antenna elements or another term.

It is to be appreciated that any of the switches discussed above may be implemented with one or more n-type field effect transistors (NFETs), one or more p-type field effect transistors (PFETs), a transmission gate, or another type of switch. For an example of a switch implemented with an NFET, the switch is turned on by applying a high voltage (e.g., supply voltage) to the gate of the NFET and turned off by applying a low voltage (e.g., ground) to the gate of the NFET. For an example of a switch implemented with a PFET, the switch is turned off by applying a high voltage (e.g., supply voltage) to the gate of the PFET and turned on by applying a low voltage (e.g., ground) to the gate of the PFET.

Within the present disclosure, the word "exemplary" is used to mean "serving as an example, instance, or illustration." Any implementation or aspect described herein as "exemplary" is not necessarily to be construed as preferred or advantageous over other aspects of the disclosure. Likewise, the term "aspects" does not require that all aspects of the disclosure include the discussed feature, advantage or mode of operation. The term "coupled" is used herein to refer to the direct or indirect electrical coupling between two structures. It is also to be appreciated that the term "ground" may refer to a DC ground or an AC ground, and thus the term "ground" covers both possibilities.

The previous description of the disclosure is provided to enable any person skilled in the art to make or use the disclosure. Various modifications to the disclosure will be readily apparent to those skilled in the art, and the generic principles defined herein may be applied to other variations without departing from the spirit or scope of the disclosure.

Thus, the disclosure is not intended to be limited to the examples described herein but is to be accorded the widest scope consistent with the principles and novel features disclosed herein.

What is claimed is:

1. An apparatus, comprising:
   a transformer including a first inductor, a second inductor, and a third inductor;
   a power amplifier coupled to the first inductor;
   a first antenna coupled to a first terminal of the second inductor;
   a second antenna coupled to a second terminal of the second inductor;
   a first switch coupled between the first terminal of the second inductor and a ground;
   a second switch coupled between the second terminal of the second inductor and the ground; and
   a low-noise amplifier coupled to the third inductor.

2. The apparatus of claim 1, wherein the first antenna comprises a patch antenna, and the second antenna comprises a dipole antenna.

3. The apparatus of claim 1, wherein the first antenna is on a first surface, the second antenna is on a second surface, and the first surface and the second surface face different directions.

4. The apparatus of claim 3, wherein the first surface and the second surface are orientated approximately perpendicular to each other.

5. The apparatus of claim 1, wherein the power amplifier is a differential power amplifier having a first output and a second output, the first output is coupled to a first terminal of the first inductor, and the second output is coupled to a second terminal of the first inductor.

6. The apparatus of claim 1, further comprising a shunt inductor coupled between the second inductor and a ground.

7. The apparatus of claim 6, wherein the shunt inductor is coupled to a center tap of the second inductor.

8. The apparatus of claim 1, further comprising:
   a first shunt inductor coupled in parallel with the first switch; and
   a second shunt inductor coupled in parallel with the second switch.

9. The apparatus of claim 1, further comprising a controller configured to:
   turn off the first switch and turn on the second switch in a first antenna mode; and
   turn on the first switch and turn off the second switch in a second antenna mode.

10. The apparatus of claim 1, further comprising a third switch coupled between an input of the low-noise amplifier and the ground.

11. The apparatus of claim 1, further comprising a third switch coupled between a first terminal of the third inductor and the ground, wherein an input of the low-noise amplifier is coupled to a second terminal of the third inductor.

12. The apparatus of claim 11, further comprising a fourth switch coupled between the input of the low-noise amplifier and the ground.

13. The apparatus of claim 12, further comprising a controller configured to:
   turn off the third switch and turn on the fourth switch in a transmit mode; and
   turn on the third switch and turn off the fourth switch in a receive mode.

14. A wireless device, comprising:
   a first antenna array comprising a first plurality of antennas;
   a second antenna array comprising a second plurality of antennas;
   a plurality of power amplifiers;
   a plurality of low-noise amplifiers; and
   a plurality of switching circuits, wherein each of the plurality of switching circuits comprises:
      a transformer including a first inductor, a second inductor, and a third inductor, wherein the first inductor is coupled to a respective one of the plurality of power amplifiers, a first terminal of the second inductor is coupled to a respective one of the first plurality of antennas, a second terminal of the second inductor is coupled to a respective one of the second plurality of antennas, and the third inductor is coupled to a respective one of the plurality of low-noise amplifiers;
      a first switch coupled between the first terminal of the second inductor and a ground; and
      a second switch coupled between the second terminal of the second inductor and the ground.

15. The wireless device of claim 14, wherein each of the first plurality of antennas comprises a patch antenna, and each of the second plurality antennas comprises a dipole antenna.

16. The wireless device of claim 14, wherein the first plurality of antennas are on a first surface, the second plurality of antennas are on a second surface, and the first surface and the second surface face different directions.

17. An apparatus, comprising:
   a transformer including a first inductor, a second inductor, a third inductor, and a fourth inductor;
   a power amplifier coupled to the first inductor;
   a low-noise amplifier coupled to the second inductor
   a first antenna coupled to a first terminal of the third inductor;
   a first switch coupled between a second terminal of the third inductor and a ground;
   a second antenna coupled to a first terminal of the fourth inductor; and
   a second switch coupled between a second terminal of the fourth inductor and the ground.

18. The apparatus of claim 17, wherein the first antenna comprises a patch antenna, and the second antenna comprises a dipole antenna.

19. The apparatus of claim 17, wherein the first antenna is on a first surface, the second antenna is on a second surface, and the first surface and the second surface face different directions.

20. The apparatus of claim 17, further comprising:
   a first shunt inductor coupled in parallel with the first switch; and
   a second shunt inductor coupled in parallel with the second switch.

21. The apparatus of claim 17, further comprising a controller configured to:
   turn on the first switch and turn off the second switch in a first antenna mode; and
   turn off the first switch and turn on the second switch in a second antenna mode.

22. The apparatus of claim 17, further comprising a third switch coupled between an input of the low-noise amplifier and the ground.

23. The apparatus of claim 17, further comprising:
a third switch coupled between the first terminal of the third inductor and the ground; and
a fourth switch coupled between the first terminal of the fourth inductor and the ground.

24. The apparatus of claim 23, further comprising a controller configured to:
turn on the first switch, turn off the second switch, turn off the third switch, and turn on the fourth switch in a first antenna mode; and
turn off the first switch, turn on the second switch, turn on the third switch, and turn off the fourth switch in a second antenna mode.

25. The apparatus of claim 17, wherein a first terminal of the second inductor is coupled to an input of the low-noise amplifier, and the apparatus further comprising a third switch coupled between a second terminal of the second inductor and a ground.

26. The apparatus of claim 25, further comprising a fourth switch coupled between the input of the low-noise amplifier and the ground.

27. The apparatus of claim 26, further comprising a controller configured to:
turn on the third switch and turn off the fourth switch in a receive mode; and
turn off the third switch and turn on the fourth switch in a transmit mode.

28. A wireless device, comprising:
a first antenna array comprising a first plurality of antennas;
a second antenna array comprising a second plurality of antennas;
a plurality of power amplifiers;
a plurality of low-noise amplifiers; and
a plurality of switching circuits, wherein each of the plurality of switching circuits comprises:
a transformer including a first inductor, a second inductor, a third inductor, and a fourth inductor, wherein the first inductor is coupled to a respective one of the plurality of power amplifiers, the second inductor is coupled to a respective one of the plurality of low-noise amplifiers, a first terminal of the third inductor is coupled to a respective one of the first plurality of antennas, and a first terminal of the fourth inductor is coupled to a respective one of the second plurality of antennas;
a first switch coupled between a second terminal of the third inductor and a ground; and
a second switch coupled between a second terminal of the fourth inductor and the ground.

29. The wireless device of claim 28, wherein each of the first plurality of antennas comprises a patch antenna, and each of the second plurality antennas comprises a dipole antenna.

30. The wireless device of claim 28, wherein the first plurality of antennas are on a first surface, the second plurality of antennas are on a second surface, and the first surface and the second surface face different directions.

* * * * *